(12) United States Patent
Huang

(10) Patent No.: US 10,951,013 B2
(45) Date of Patent: Mar. 16, 2021

(54) MULTIPLE INPUT POWER DISTRIBUTION SHELF AND BUS BAR ASSEMBLY THEREOF

(71) Applicant: Delta Electronics, Inc., Taoyuan (TW)

(72) Inventor: Yu-Hung Huang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/419,902

(22) Filed: May 22, 2019

(65) Prior Publication Data
US 2019/0273366 A1 Sep. 5, 2019

Related U.S. Application Data

(62) Division of application No. 15/861,495, filed on Jan. 3, 2018, now Pat. No. 10,404,041.

(Continued)

(30) Foreign Application Priority Data

Nov. 29, 2017 (CN) .......................... 201711228317.0

(51) Int. Cl.
*H02B 1/21* (2006.01)
*H02B 1/48* (2006.01)
(Continued)

(52) U.S. Cl.
CPC .............. *H02B 1/20* (2013.01); *G06F 1/189* (2013.01); *H01R 9/24* (2013.01); *H01R 33/94* (2013.01);
(Continued)

(58) Field of Classification Search
None
See application file for complete search history.

(56) References Cited

U.S. PATENT DOCUMENTS 6,459,571 B1 * 10/2002 Carteau .................. G06F 1/184
312/35
7,643,281 B2 * 1/2010 Okamoto ............. G11B 33/126
360/69
(Continued)

FOREIGN PATENT DOCUMENTS

CN 102508542 A 6/2012
CN 205158273 U 4/2016
(Continued)

*Primary Examiner* — Courtney L Smith
(74) *Attorney, Agent, or Firm* — Kirton McConkie; Evan R. Witt

(57) ABSTRACT

A multiple input power distribution shelf and a bus bar assembly thereof are provided. The power distribution shelf is installed in the server rack and comprises plural power supply units. The bus bar assembly comprises a first linking bus bar, a second linking bus bar, an insulation member and plural power connectors. The first linking bus bar comprises a first main bar, plural first bending parts and at least one first output part. The second linking bus bar comprises a second main bar, plural second bending parts and at least one second output part. The insulation member is disposed between the first main bar and the second main bar for insulation. The power connectors are mounted on the bending parts and connect with the power supply units. The first output part and the second output part are electrically connected with a rack bus bar of the server rack.

22 Claims, 26 Drawing Sheets

Related U.S. Application Data

(60) Provisional application No. 62/553,188, filed on Sep. 1, 2017.

(51) Int. Cl.
    *H02B 1/20*     (2006.01)
    *G06F 1/18*     (2006.01)
    *H02B 1/56*     (2006.01)
    *H02G 5/02*     (2006.01)
    *H05K 7/14*     (2006.01)
    *H01R 9/24*     (2006.01)
    *H01R 33/94*     (2006.01)
    *H02J 3/06*     (2006.01)

(52) U.S. Cl.
    CPC ............... *H02B 1/48* (2013.01); *H02B 1/56* (2013.01); *H02G 5/025* (2013.01); *H02J 3/06* (2013.01); *H05K 7/1492* (2013.01)

(56) References Cited

U.S. PATENT DOCUMENTS

| | | | |
|---|---|---|---|
| 9,320,166 B1* | 4/2016 | Marr | H05K 7/14 |
| 9,582,057 B2* | 2/2017 | Hartman | H05K 7/20836 |
| 10,133,328 B2* | 11/2018 | Che | G05B 9/02 |
| 10,348,124 B1* | 7/2019 | MacGregor | G06F 1/28 |
| 10,404,041 B2* | 9/2019 | Huang | H01R 33/94 |
| 10,511,186 B1* | 12/2019 | Mische | H01H 47/002 |
| 2004/0160720 A1* | 8/2004 | Yamanashi | G06F 1/20 |
| | | | 361/103 |
| 2008/0258556 A1* | 10/2008 | Ewing | H01H 33/121 |
| | | | 307/23 |
| 2010/0220436 A1* | 9/2010 | Miyamoto | G06F 1/187 |
| | | | 361/679.32 |
| 2011/0133560 A1* | 6/2011 | Yamashita | G06F 1/30 |
| | | | 307/66 |
| 2012/0042112 A1* | 2/2012 | Thomas, III | G06F 13/4081 |
| | | | 710/313 |
| 2012/0181869 A1* | 7/2012 | Chapel | G06F 1/3287 |
| | | | 307/64 |
| 2016/0329689 A1 | 11/2016 | Yi | |
| 2018/0322011 A1* | 11/2018 | Batcheller | H02H 7/20 |
| 2019/0104632 A1* | 4/2019 | Nelson | H05K 7/20727 |

FOREIGN PATENT DOCUMENTS

| | | |
|---|---|---|
| CN | 107111348 A | 8/2017 |
| DE | 3813099 A1 | 11/1989 |
| EP | 2006989 A2 | 12/2008 |
| WO | 03/069747 A2 | 8/2003 |
| WO | 2017006586 A1 | 1/2017 |

\* cited by examiner

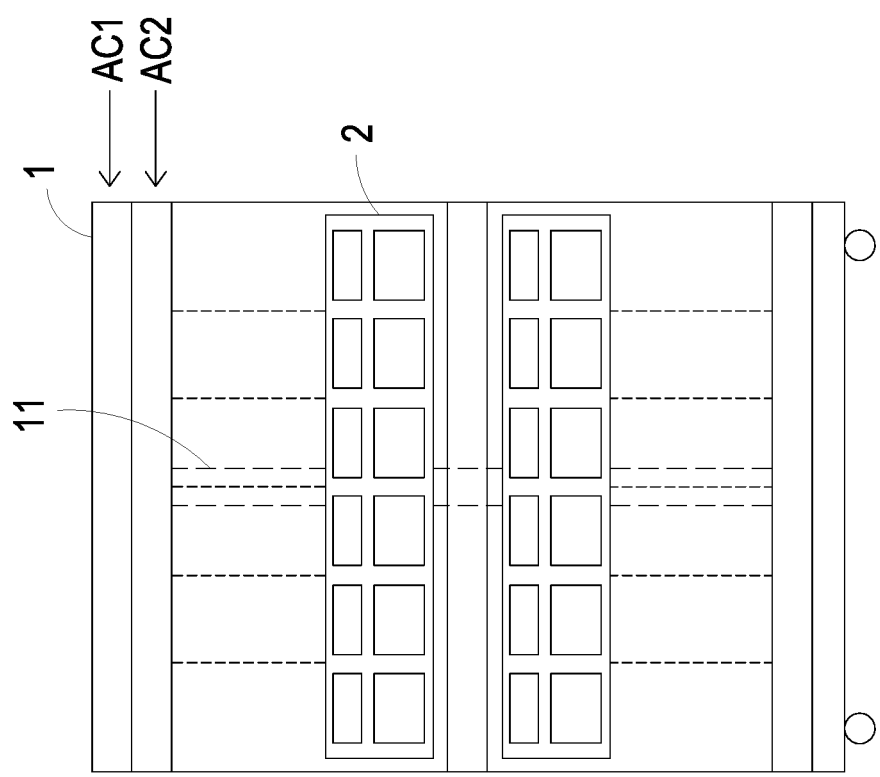

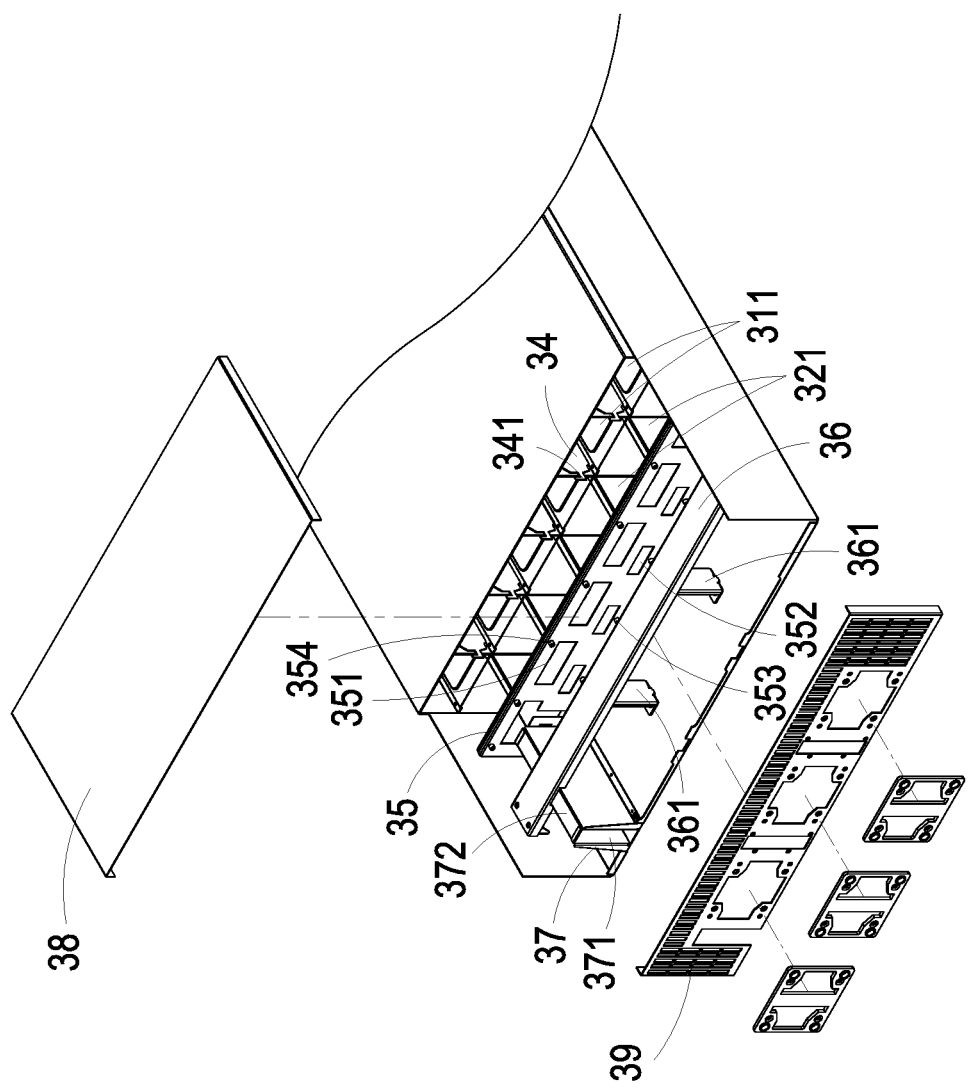

MULTIPLE INPUT POWER DISTRIBUTION SHELF AND BUS BAR ASSEMBLY THEREOF

CROSS-REFERENCE TO RELATED APPLICATION

This application is a Divisional Application of U.S. patent application Ser. No. 15/861,495 filed on Jan. 3, 2018, and entitled "MULTIPLE INPUT POWER DISTRIBUTION SHELF AND BUS BAR ASSEMBLY THEREOF", which claims the benefit of U.S. Provisional Application No. 62/553,188 filed on Sep. 1, 2017, entitled "MULTIPLE INPUT POWER DISTRIBUTION SHELF", and claims priority to China Patent Application No. 201711228317.0 filed on Nov. 29, 2017. The entire contents of the above-mentioned patent applications are incorporated herein by reference for all purposes.

FIELD OF THE DISCLOSURE

The present disclosure relates to a power distribution shelf, and more particularly to a multiple input power distribution shelf and a bus bar assembly thereof.

BACKGROUND OF THE DISCLOSURE

With increasing development of information industries and networks, the services provided through networks are becoming more and more popular in various applications. Nowadays, data center has been widely applied to cloud computing and large-scale data and application services in information technology (IT) operations. In order to ensure the normal operations of the server racks in the data center, it is important to supply uninterrupted power to the IT equipment of the server racks in the data center.

Generally, the server rack is connected to an AC power source, and the server rack converts the AC input power to required DC output power for the IT equipment via power supply units (PSUs). To ensure redundancy, a plurality of power supply units mounted in plural power shelves are employed and installed in the server rack. In addition, a plurality of battery backup units (BBUs) are also employed to provide backup power when the power supply units fail or when the AC power source is uninterrupted or failure. Typically, the battery backup units are placed in a battery chassis, which is installed in the same server rack. Consequently, the power shelves and the battery chassis take up some space in the server rack. In addition, the power supply units and the battery backup units are heavy components and need to be replaced for maintenances, repairs and/or upgrades. Therefore, it is difficult to maintain and the maintain cost is expensive. Moreover, the electrical and mechanical connections among the power supply units in the power shelves, the battery backup units in the battery chassis, the rack bus bar and the AC power source are complex and the power and signal transmission paths are long, so that the transmission loss is increased. Consequently, the cost is high, and the power distribution efficiency is low.

Therefore, there is a need of providing a multiple input power distribution shelf and a bus bar assembly thereof to obviate the drawbacks encountered from the prior arts.

SUMMARY OF THE DISCLOSURE

It is an object of the present disclosure to provide a multiple input power distribution shelf and a bus bar assembly thereof for allowing the hot-swappable power supply units and the hot-swappable battery backup units to be installed in a single chassis and allowing the power supply units of the power distribution shelf to connect with two AC power sources and switch between the two AC power sources according to the status. Consequently, it is labor-saving, time-saving and cost-saving to install and maintain the power supply units and the battery backup units, and the power distribution shelf can provide required DC output power to the server rack continuously.

It is an object of the present disclosure to provide a multiple input power distribution shelf and a bus bar assembly thereof with high power distribution efficiency and excellent heat-dissipation efficiency. The electrical and mechanical connecting structures among the power supply units, the battery backup units, the power shelf controller and the multiple AC power sources are simplified via a mid-plane circuit board. In addition, the bus bar assembly is employed in the power distribution shelf to connect the power output electrodes of the power supply units with the rack bus bar and transfer the DC output power from the power supply units to the rack bus bar. Consequently, the purposes of further miniaturization of the power distribution shelf and improvement in energy efficiency are achieved. Moreover, the cost is reduced and the reliability is enhanced.

In accordance with an aspect of the present disclosure, there is provided a bus bar assembly. The bus bar assembly is capable of use with a power distribution shelf. The power distribution shelf is installed in the server rack and comprises plural power supply units. The bus bar assembly comprises a first linking bus bar, a second linking bus bar, an insulation member and plural power connectors. The first linking bus bar comprises a first main bar, plural first bending parts and at least one first output part. The first bending part and the at least one first output part are connected to two opposite sides of the first main bar respectively. The plural first bending parts are separated apart with each other at a specific interval. The second linking bus bar is corresponding to the first linking bus bar and comprises a second main bar, plural second bending parts and at least one second output part. The second bending part and the at least one second output part are connected to two opposite sides of the second main bar respectively. The plural second bending parts are separated apart with each other at a specific interval. The insulation member is disposed between the first main bar and the second main bar. The first main bar and the second main bar are insulated with each other by the insulation member. The plural power connectors are mounted on the plural first bending parts and the plural second bending parts. The plural power connectors are configured to electrically connect with the plural power supply units. The first output part and the second output part are electrically connected with a rack bus bar of the server rack.

In accordance with another aspect of the present disclosure, there is provided a multiple input power distribution shelf. The multiple input power distribution shelf is installed in a server rack and selectively receives an AC input power from plural AC power sources. The multiple input power distribution shelf converts the AC input power into a DC output power and provides the DC output power to a rack bus bar of the server rack. The multiple input power distribution shelf comprises a chassis, plural AC input power connectors, plural power supply units, plural battery backup units, a mid-plane circuit board and a bus bar assembly. The plural AC input power connectors are mounted in the chassis and configured to electrically connect with the plural AC power sources and receive the AC input power. The plural power supply units are detachably mounted in the chassis. The plural battery backup units are detachably mounted in the chassis and electrically connected with the plural power supply units respectively. The mid-plane circuit board is electrically connected with the plural AC input power connectors, the plural power supply units and the plural battery backup units. The bus bar assembly is mounted in the chassis and configured to connect with the plural power supply units and the rack bus bar of the server rack. The power outputted by the plural power supply units is transferred to the rack bus bar through the bus bar assembly.

The above contents of the present disclosure will become more readily apparent to those ordinarily skilled in the art after reviewing the following detailed description and accompanying drawings, in which:

BRIEF DESCRIPTION OF THE DRAWINGS

FIG. 1A is a block diagram illustrating an example of a server rack having a multiple input power distribution shelf according to an embodiment of the present disclosure;

FIG. 4B is an explored view showing a rear portion of the chassis of FIG. 4A;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1B:
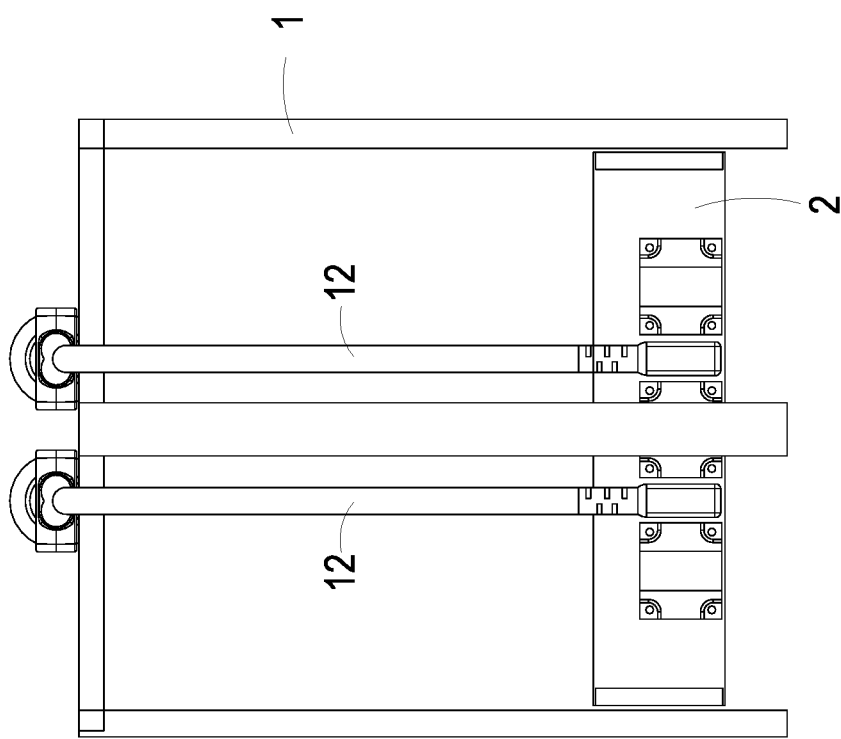
FIG. 1B is a schematic view showing the multiple input power distribution shelf of FIG. 1A receiving AC input power from two AC power sources.
Figure 2A:
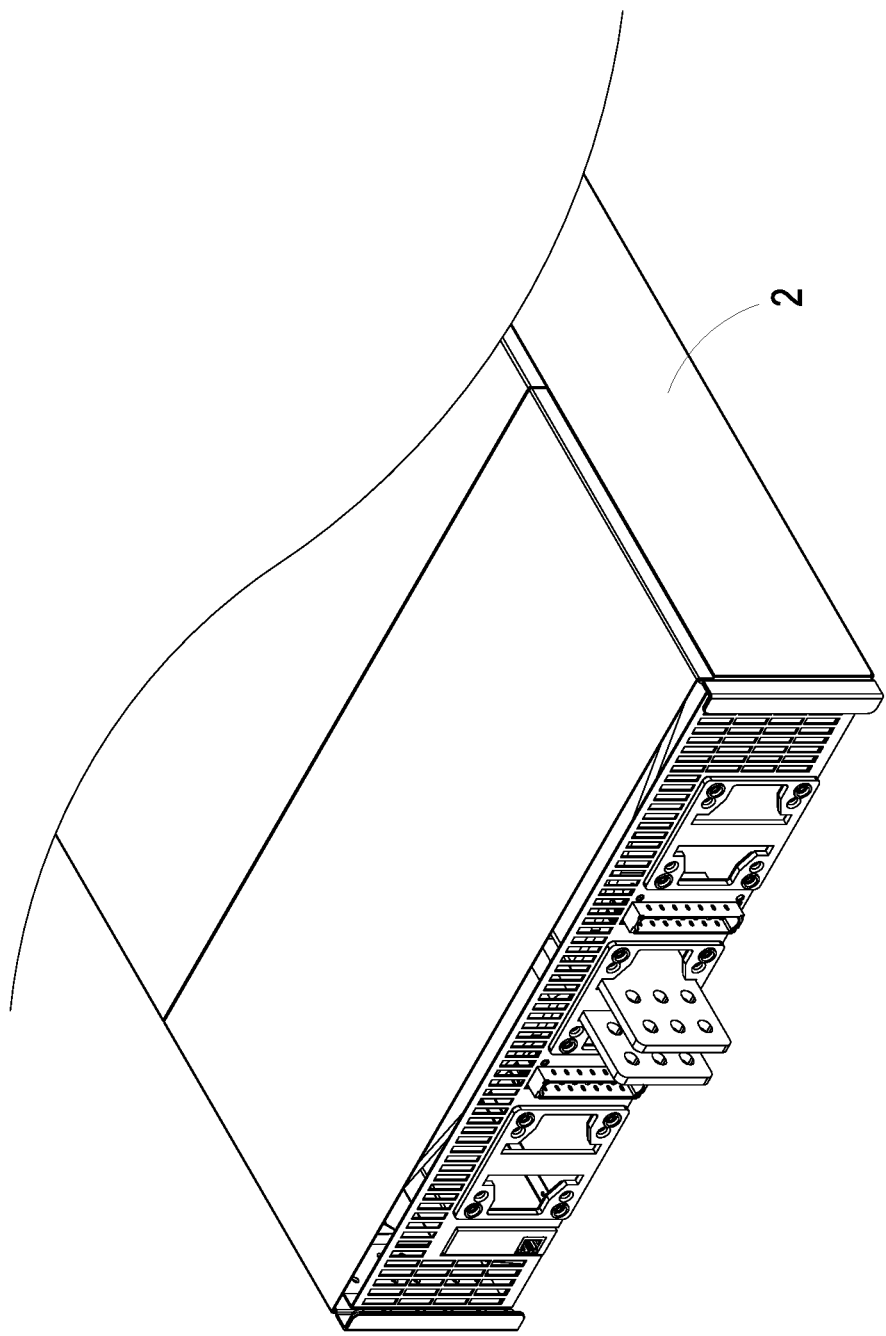
FIG. 2A is a schematic perspective view illustrating a rear portion of a multiple input power distribution shelf according to an embodiment of the present disclosure.
Figure 2B:
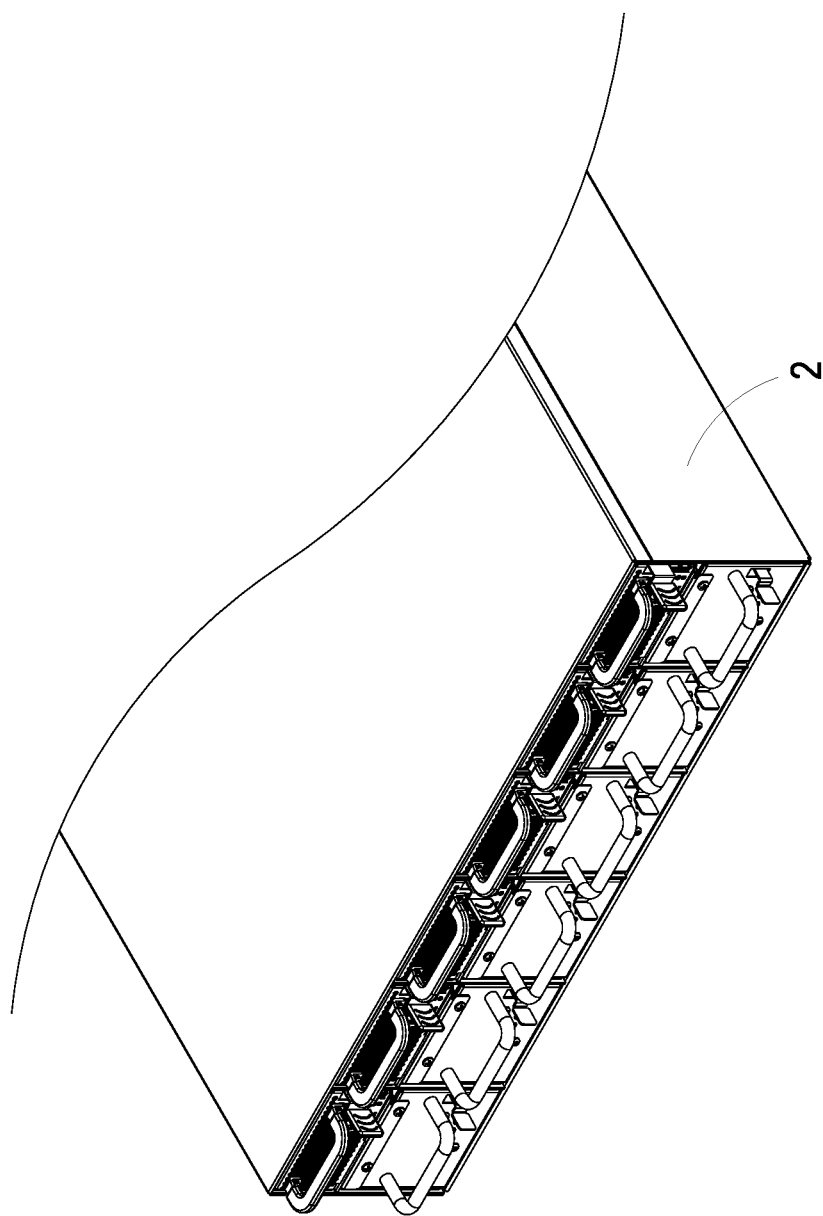
FIG. 2B is a schematic perspective view illustrating a front portion of the multiple input power distribution shelf of FIG. 2A.

FIG. 1A is a block diagram illustrating an example of a server rack having a multiple input power distribution shelf according to an embodiment of the present disclosure, FIG. 1B is a schematic view showing the multiple input power distribution shelf of FIG. 1A receiving AC input power from two AC power sources, FIG. 2A is a schematic perspective view illustrating a rear portion of a multiple input power distribution shelf according to an embodiment of the present disclosure, and FIG. 2B is a schematic perspective view illustrating a front portion of the multiple input power distribution shelf of FIG. 2A. As shown in FIGS. 1A, 2A and 2B, the multiple input power distribution shelf 2 (hereinafter also referred to as power distribution shelf) is installed in the server rack 1 and can be drawn out from the server rack 1 for maintenances. The power distribution shelf 2 receives AC input power from two AC power sources (AC1, AC2), converts the AC input power into DC output power and provides the DC output power to the rack bus bar 11. Consequently, the power distribution shelf 2 can provide required and uninterrupted DC output power to the IT equipment in the server rack 1. In an embodiment, as shown in FIG. 1B, the power distribution shelf 2 receives AC input power from two AC power sources (AC1, AC2) via two AC power cables 12 respectively.

Figure 3:
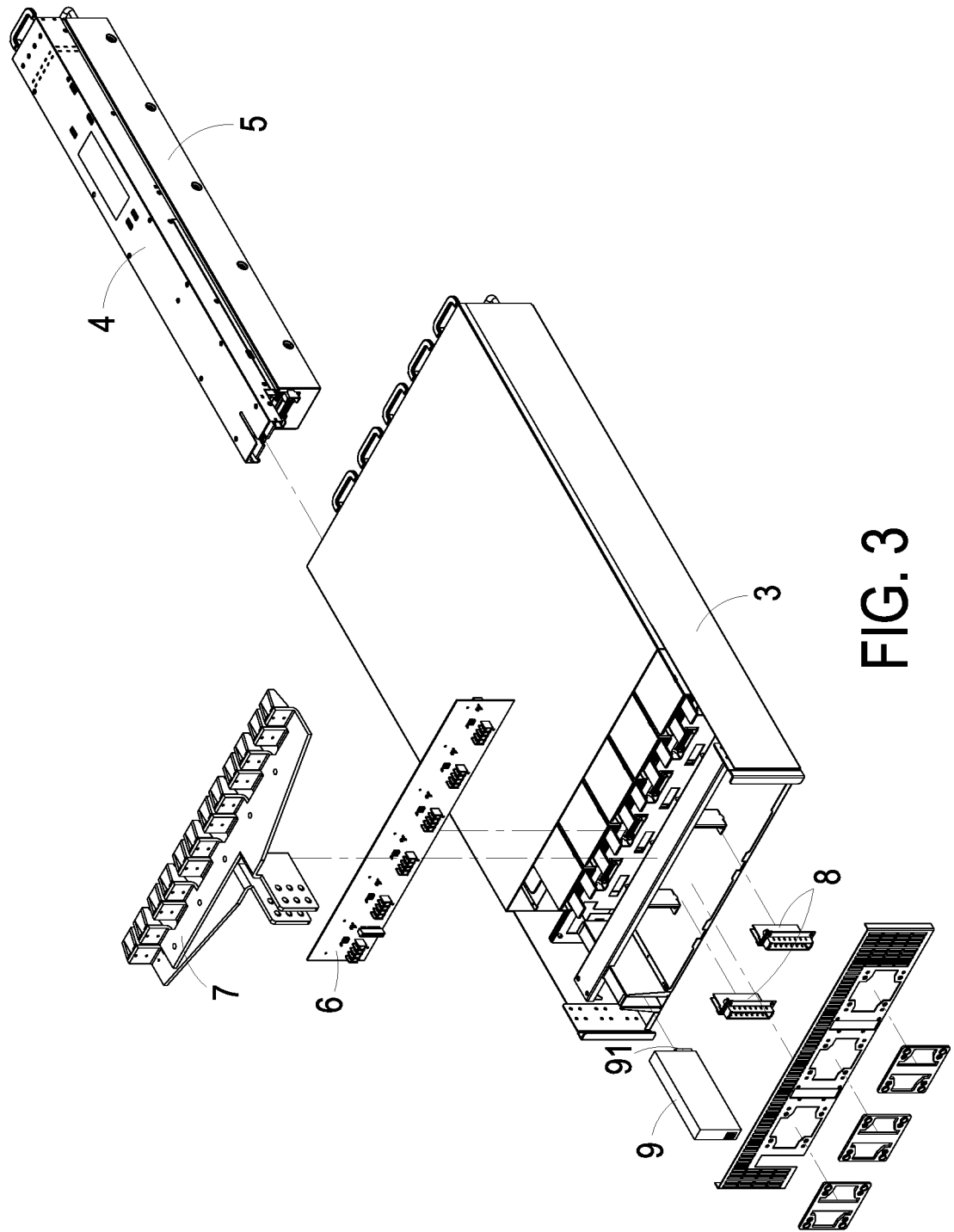
FIG. 3 is an explored view showing the multiple input power distribution shelf of FIG. 2A.

FIG. 3 is an explored view showing the multiple input power distribution shelf of FIG. 2A. As shown in FIG. 3, the power distribution shelf 2 includes a chassis 3, a plurality of power supply units 4, a plurality of battery backup units 5, a mid-plane circuit board 6, a bus bar assembly 7, a plurality of AC input power connectors 8 and a power shelf controller 9. The power supply units 4, the battery backup units 5, the mid-plane circuit board 6, the bus bar assembly 7, the AC input power connectors 8 and the power shelf controller 9 are installed and mounted in the chassis 3. The power supply units 4 are electrically connected with the AC input power connectors 8 via the mid-plane circuit board 6 and plural power cables (not shown), the power supply units 4 are electrically connected with the battery backup units 5 via the mid-plane circuit board 6. The power supply units 4 are electrically connected with the rack bus bar 11 (see FIG. 1A) via the bus bar assembly 7. The power shelf controller 9 is electrically connected with the power supply units 4 and the battery backup units 5 via the mid-plane circuit board 6.

Figure 4A:
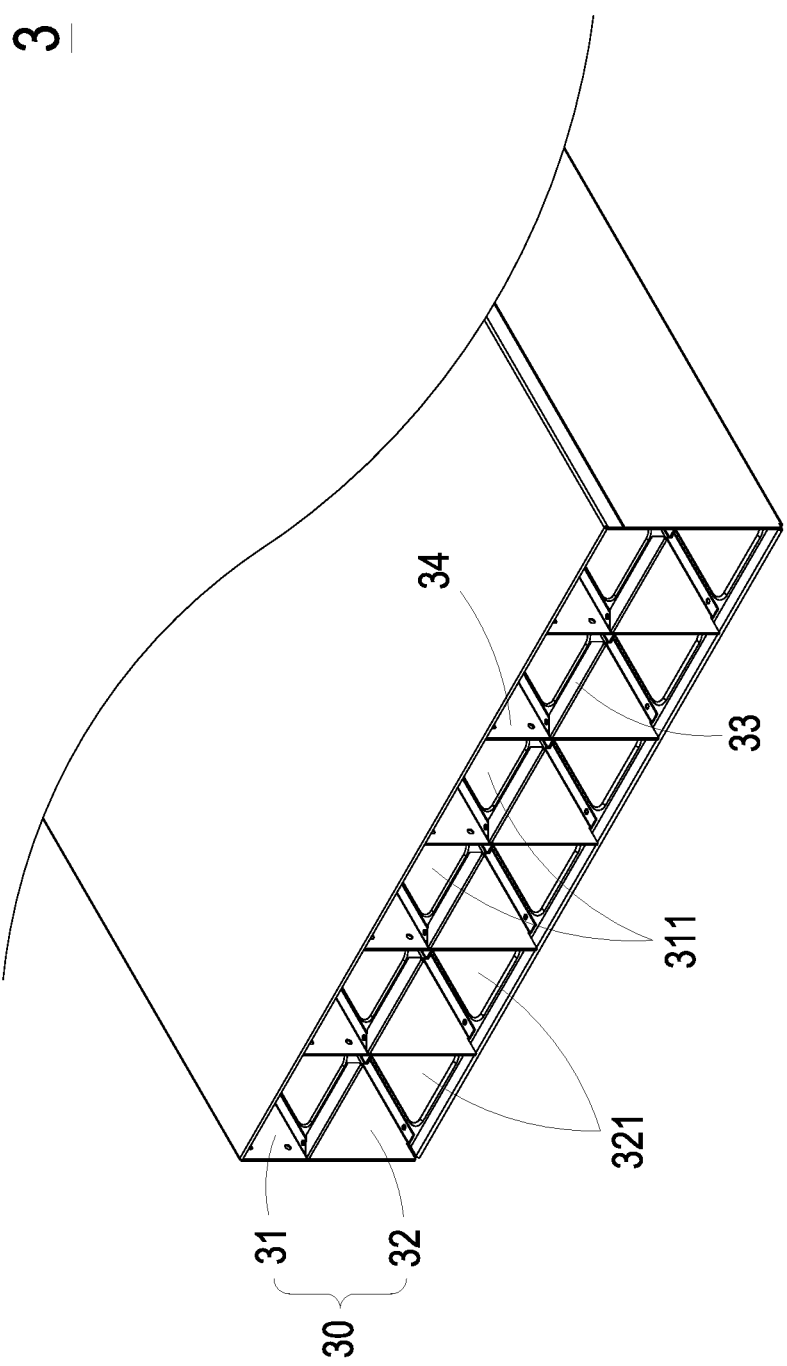
FIG. 4A is a schematic perspective view illustrating a front portion of the chassis of the multiple input power distribution shelf of FIG. 2A.

FIG. 4A is a schematic perspective view illustrating a front portion of the chassis of the multiple input power distribution shelf of FIG. 2A, and FIG. 4B is an explored view showing a rear portion of the chassis of FIG. 4A. As shown in FIGS. 3, 4A and 4B, the chassis 3 includes an accommodation space 30 having a first compartment 31 and a second compartment 32. The first compartment 31 and the second compartment 32 are separated by a plate 33. The first compartment 31 has a plurality of first slots 311, and the second compartment 32 has a plurality of second slots 321. The first slots 311 and the second slot 321 are defined by a plurality of baffles 34 within the first compartment 31 and the second compartment 32. The chassis 3 further includes a partition plate 35, a first bracket 36 and a second bracket 37. The partition plate 35 is disposed in the accommodation space 30 and located at the rear portion of the chassis 3 and covers the rear openings of the second slots 321 and portions of the rear openings of the first slots 311. The partition plate 35 has a plurality of first through holes 351 corresponding to the first slots 311 and a plurality of second through holes 352 corresponding to the second slots 321. Preferably but not exclusively, the first bracket 36 is a transverse strip disposed in the accommodation space 30 and connected to two opposite sidewalls of the chassis 3. The first bracket 36 is configured to support the bus bar assembly 7. In an embodiment, the chassis 3 further includes at least one supporting pillar 361, such as the two supporting pillars 361 shown in FIG. 4B. One terminal of the supporting pillar 361 is connected to the first bracket 36, and the other terminal of the supporting pillar 361 is connected to the inner surface of the bottom plate of the chassis 3. The supporting pillar 361 is configured to support the first bracket 36 so that the first bracket 36 supports the bus bar assembly 7 more stably. The second bracket 37 is a U-shaped frame disposed in the accommodation space 30, and mounted on the inner surface of the bottom plate of the chassis 3. The second bracket 37 forms a receiving space 371 for accommodating the power shelf controller 9 therein and has a top surface 372 for supporting the first bracket 36. The chassis 3 has a top cover 38, and the top cover 38 is detachably covering the rear portion of the chassis 3.

The power supply units 4 are hot-swappable and detachably installed into the first slots 311 of the first compartment 31 respectively, and the battery backup units 5 are hot-swappable and detachably installed into the second slots 321 of the second compartment 32 respectively. Preferably but not exclusively, the first compartment 31 has six first slots 311, and the second compartment 32 has six second slot 321. The first slots 311 are corresponding to and aligned with the second slots 321 respectively. Namely, the six power supply units 4 are installed into the six first slots 311 respectively, and the six battery backup units 5 are installed into the six second slots 321 respectively. In this embodiment, the partition plate 35 further includes a plurality of first protrusions 353 and a plurality of second protrusions 354, and each of the baffles 34 has a hook 341 formed at an edge thereof and extending outwardly from the edge. The chassis 3 further includes a rear plate 39 connected with the rear portion of the chassis 3.

Figure 5:
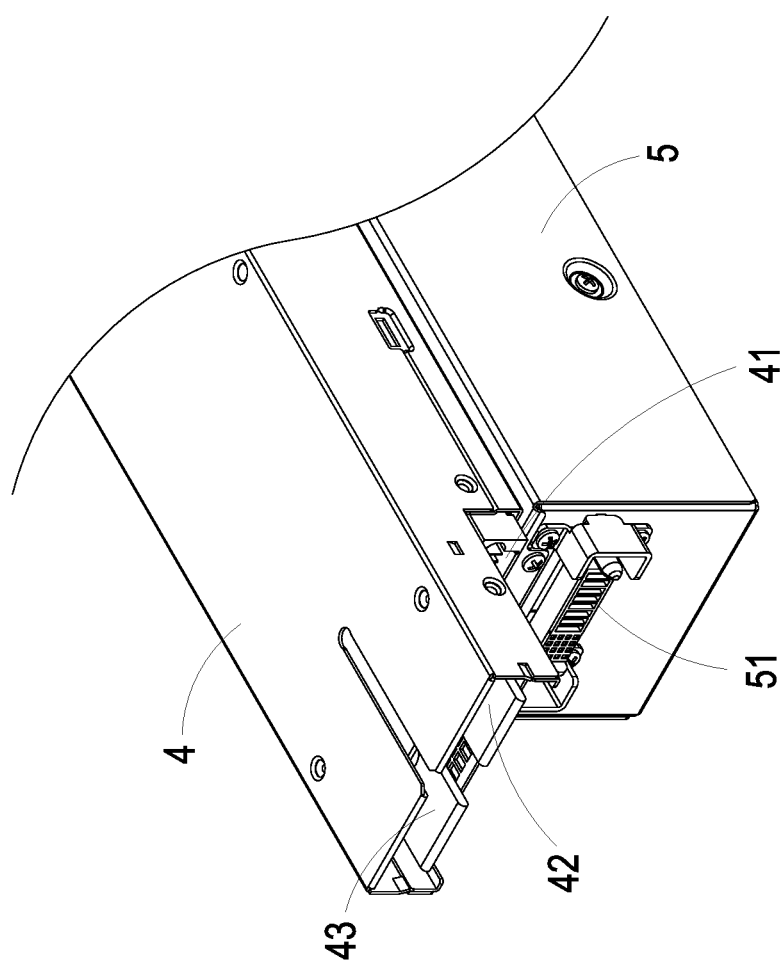
FIG. 5 is a schematic perspective view illustrating the power supply unit and the battery backup unit of the power distribution shelf of FIG. 2A.

FIG. 5 is a schematic perspective view illustrating the power supply unit and the battery backup unit of the power distribution shelf of FIG. 2A. As shown in FIG. 5, each of the power supply units 4 has a first connection interface 41, a first power output electrode 42 and a second power output electrode 43. The first connection interface 41 is located under the first power output electrode 42 and the second power output electrode 43. Preferably but not exclusively, the first power output electrode 42 and the second power output electrode 43 are copper sheets. Each of the battery backup units 5 has a second connection interface 51. Preferably but not exclusively, the second connection interface 51 is floating and mounted on the rear of the battery backup unit 5. In an embodiment, the outer edge of partial housing of the power supply unit 4 is aligned with the outer edges of the first power output electrode 42 and the second power output electrode 43. Therefore, the first power output electrode 42 and the second power output electrode 43 are protected from bending and break during inserting or pulling out the power supply unit 4.

Figure 6A:
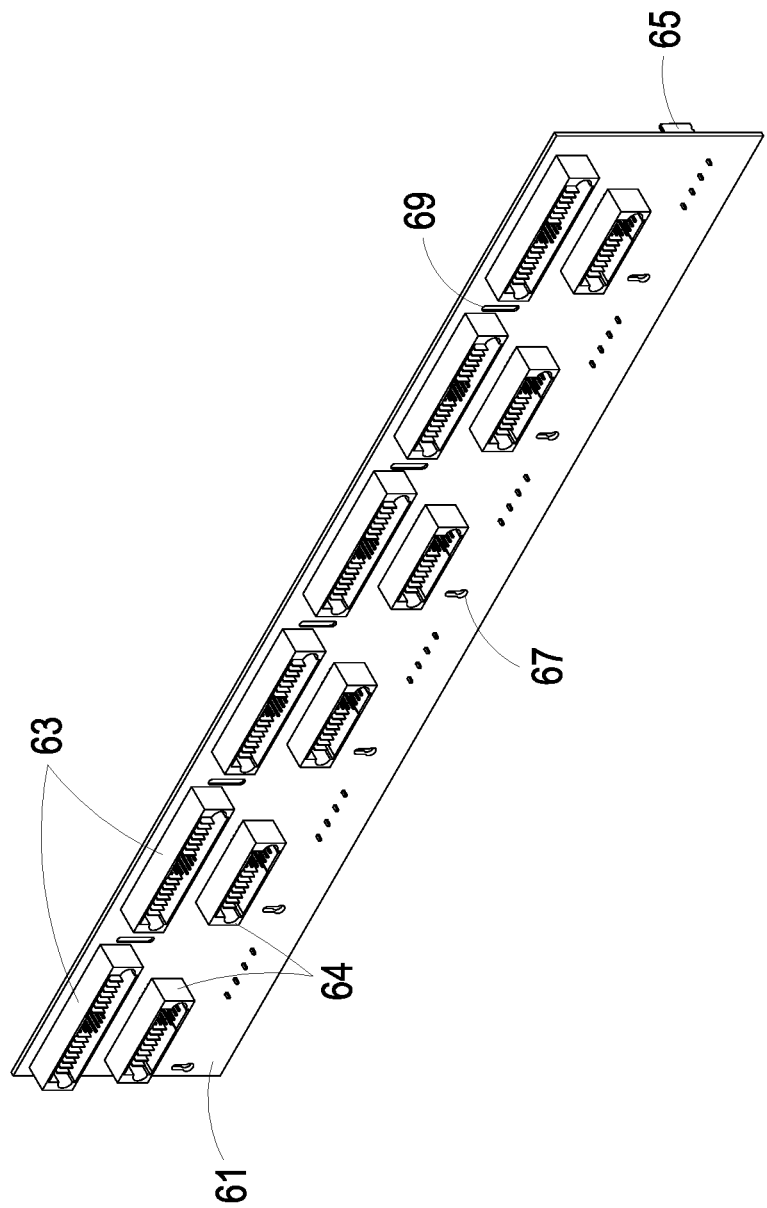
FIGS. 6A, 6B and 6C are schematic perspective views illustrating the mid-plane circuit board of the power distribution shelf of FIG. 2A at various viewing angles.
Figure 6B:
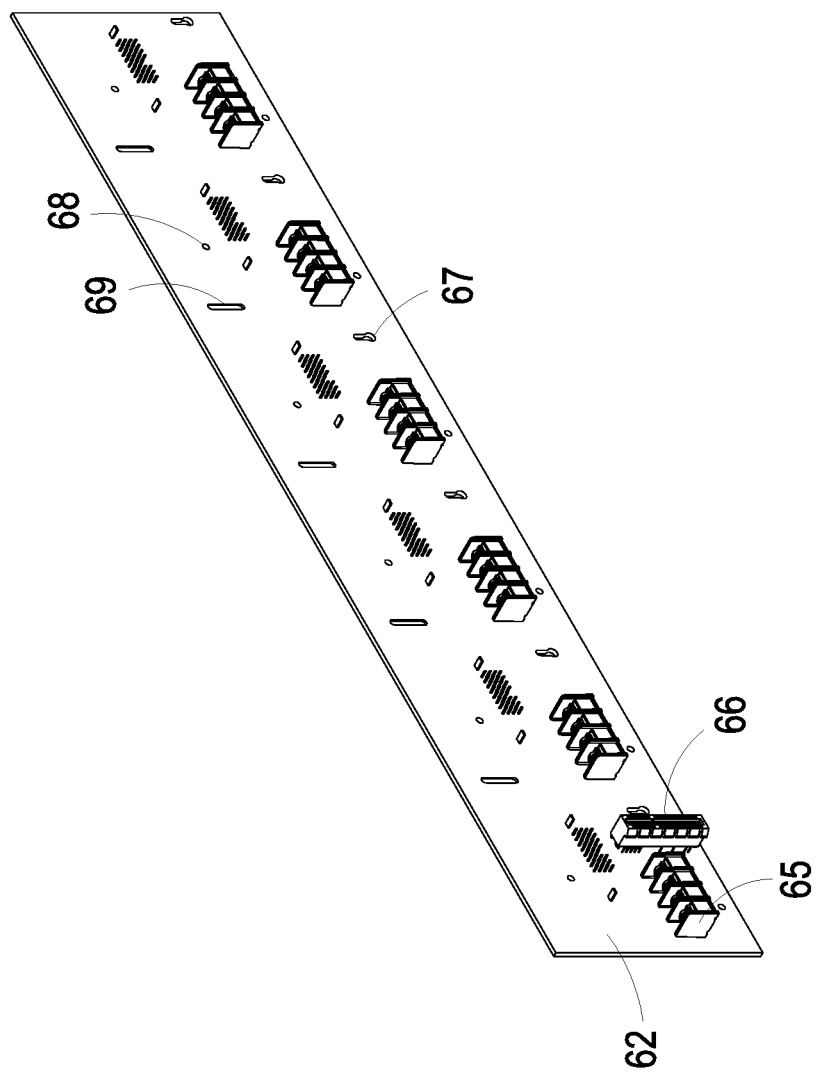
Figure 6D:
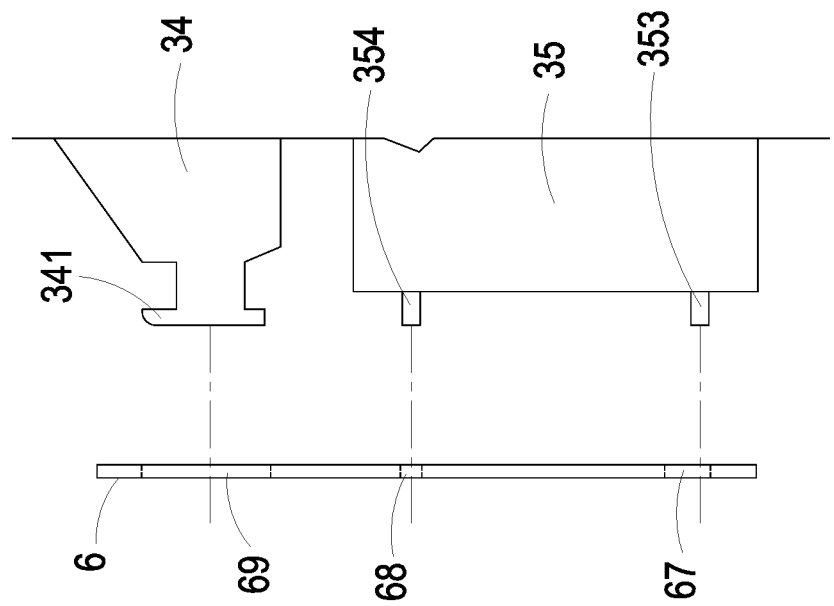
FIG. 6D is a schematic view showing the mid-plane circuit board fastened by the partition plate and the baffles of the chassis.
Figure 6C:
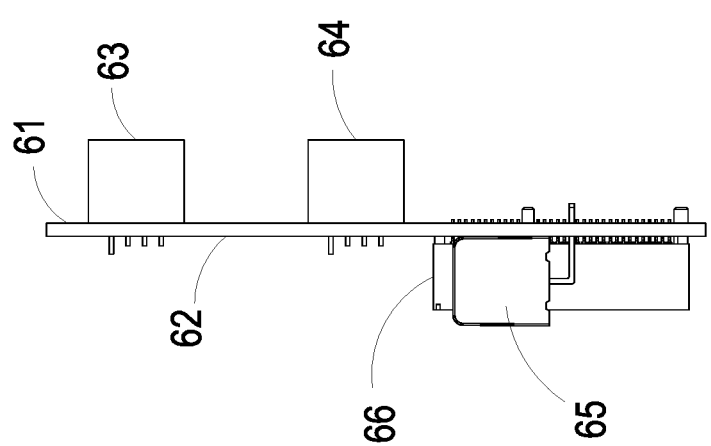

FIGS. 6A, 6B and 6C are schematic perspective views illustrating the mid-plane circuit board of the power distribution shelf of FIG. 2A at various viewing angles, and FIG. 6D is a schematic view showing the mid-plane circuit board fastened by the partition plate and the baffles of the chassis. As shown in FIGS. 6A, 6B and 6C, the mid-plane circuit board 6 includes a first surface 61, a second surface 62, a plurality of first connectors 63, a plurality of second connectors 64, a plurality of third connectors 65, and a fourth connector 66. The first connectors 63 are mounted on the first surface 61, arranged in a first line and aligned and mating with the first connection interfaces 41 (see FIG. 5) of the power supply units 4 respectively and correspondingly. The second connectors 64 are mounted on the first surface 61, arranged in a second line and aligned and mating with the second connection interfaces 51 (see FIG. 5) of the battery backup units 5 respectively and correspondingly. The third connectors 65 are mounted on the second surface 62 and arranged in a third line. Each of the third connector 65 is electrically connected with two of the AC input power connectors 8 via plural power cables 81 (see FIG. 7E). The fourth connector 66 is mounted on the second surface 62 and configured to electrically connect with a third connection interface 91 (see FIG. 3) of the power shelf controller 9. As shown in FIGS. 6A, 6B and 6D, the mid-plane circuit board 6 includes a plurality of first fixing holes 67, a plurality of second fixing holes 68, and a plurality of third fixing holes 69. The first fixing holes 67 are corresponding to and engaging with the first protrusions 353 of the partition plate 35 respectively, the second fixing holes 68 are corresponding to and engaging with the second protrusion 354 of the partition plate 35 respectively, and the third fixing holes 69 are corresponding to and engaging with the hooks 341 of the baffles 34 respectively. Consequently, the mid-plane circuit board 6 can be fastened in the chassis 3 via the partition plate 35 and the battles 34. Preferably, the mid-plane circuit board 6 is vertical to the bottom plate of the chassis 3.

In an embodiment, the mid-plane circuit board 6 has six first connectors 63, six second connectors 64, six third connectors 65 and one fourth connector 66. Each of the first connectors 63 has a first group of pins electrically coupled with the power pins of a corresponding third connector 65 by the trace patterns of the mid-plane circuit board 6. Consequently, the AC input power from the two AC power sources can be transferred to the corresponding power supply unit 4 via the first connector 63 and the third connector 65. Each of the first connector 63 has a second group of pins electrically coupled with the power pins of a corresponding second connector 64 by the trace patterns of the mid-plane circuit board 6. Consequently, the battery backup unit 5 can discharge DC voltage to the corresponding power supply unit 4 and/or the power supply units 4 can charge the DC voltage to the battery backup unit 5 via the first connector 63 and the second connector 64. Each of the first connector 63 has a third group of pins coupled with the signal pins of the corresponding second connector 64 and the signal pins of the fourth connector 66 via trace patterns of the mid-plane circuit board 6. Consequently, the signal communications among the power supply units 4, the battery backup units 5 and the power shelf controller 9 can be performed via the first connectors 63, the second connectors 64 and the fourth connector 66.

Figure 7A:
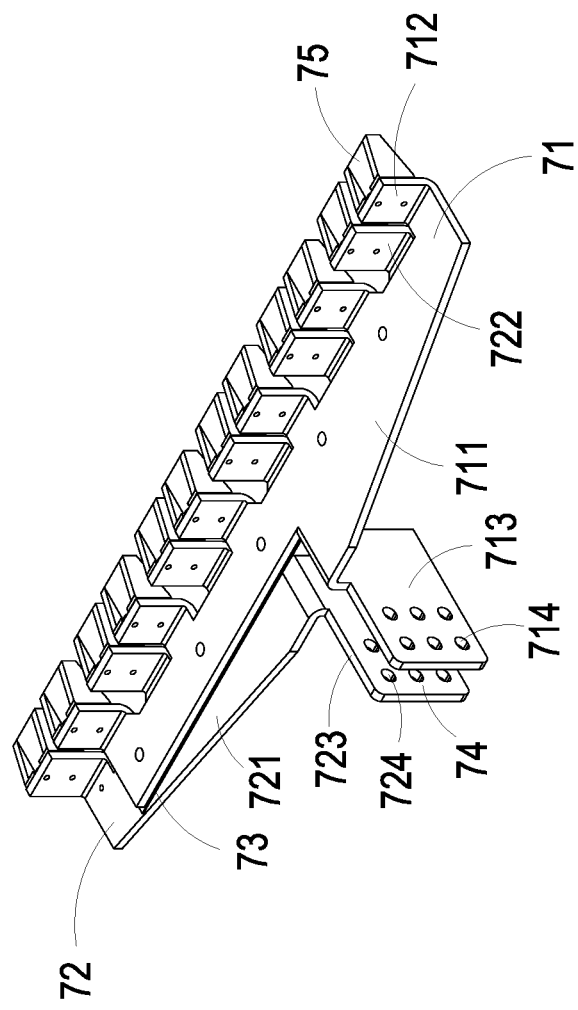
FIG. 7A is a schematic perspective view illustrating the bus bar assembly of the power distribution shelf of FIG. 2A.
Figure 7B:
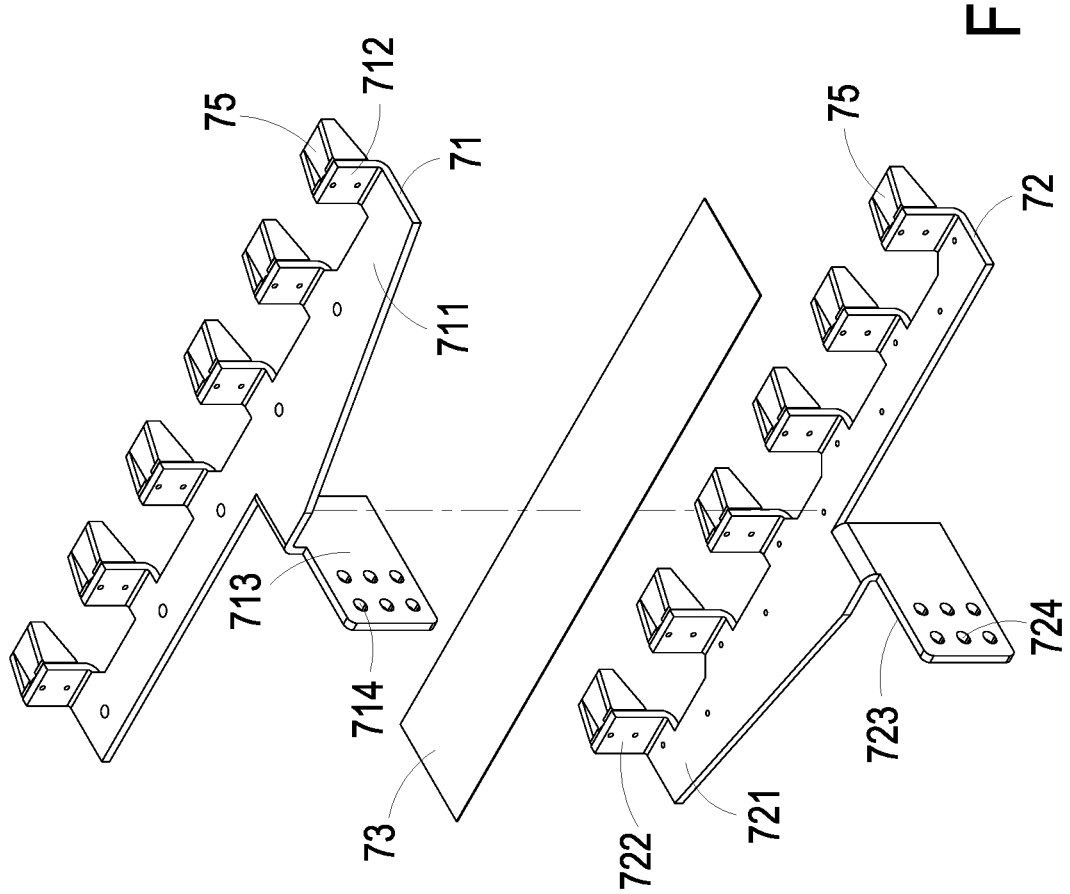
FIG. 7B is an explored view showing the bus bar assembly of FIG. 7A.
Figure 7D:
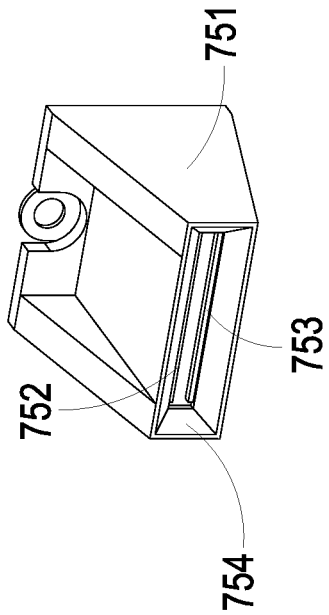
FIG. 7D is a schematic perspective view illustrating the clip-type power connector of FIG. 7C at another viewing angle.
Figure 7C:
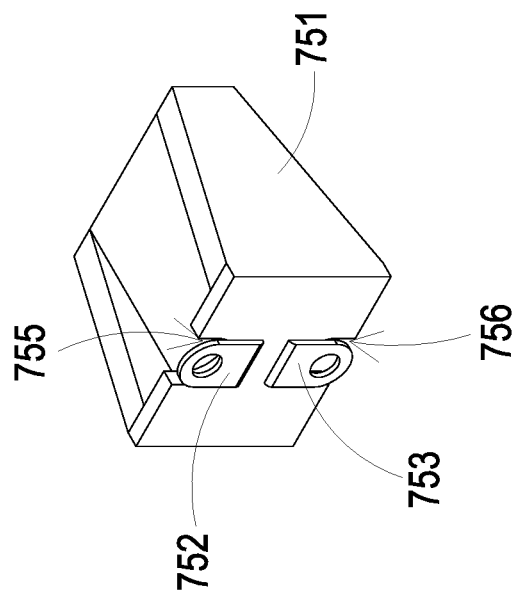
FIG. 7C is a schematic perspective view illustrating an example of the clip-type power connector of the bus bar assembly of FIG. 7A.
Figure 7E:
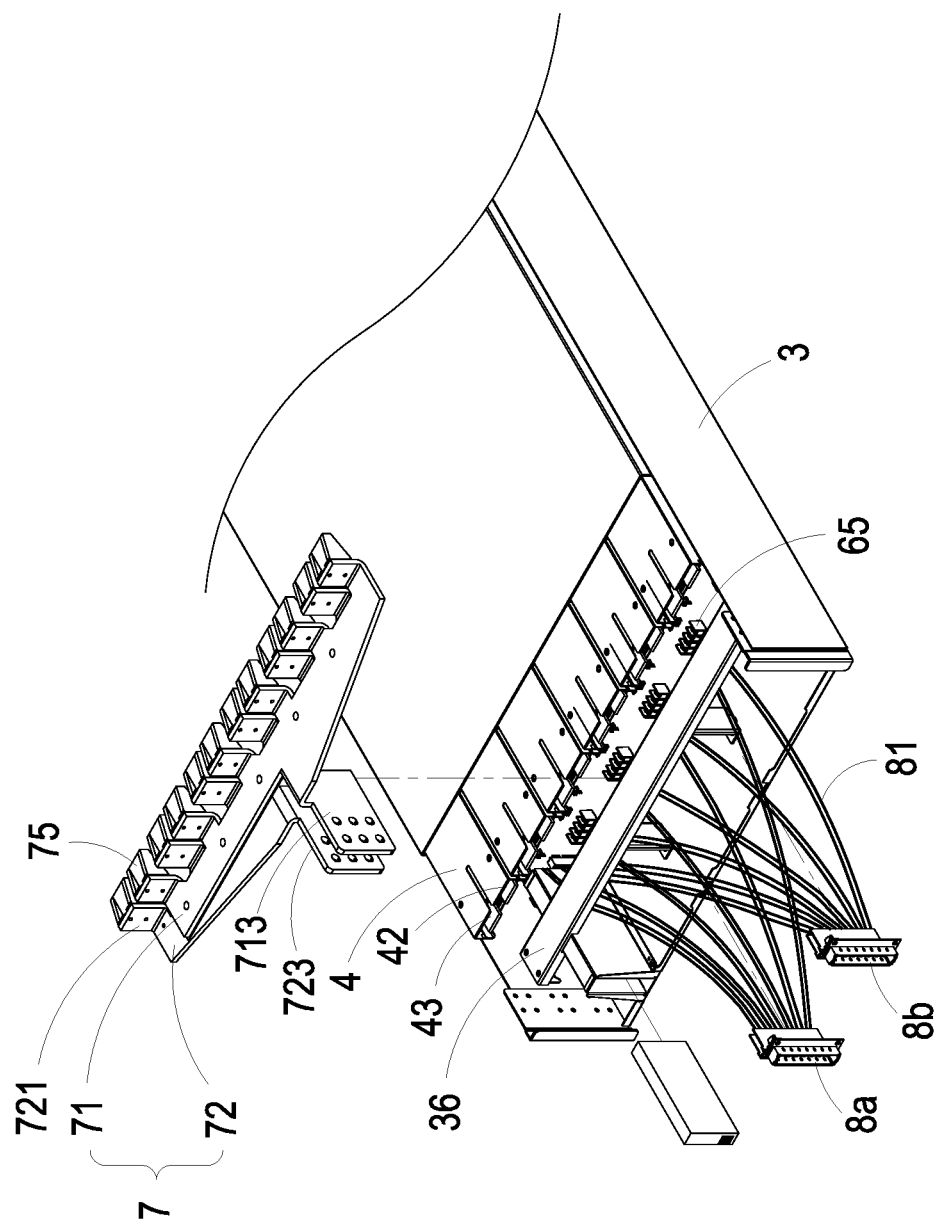
FIG. 7E is a schematic view showing the bus bar assembly fastened within the chassis.
Figure 7F:
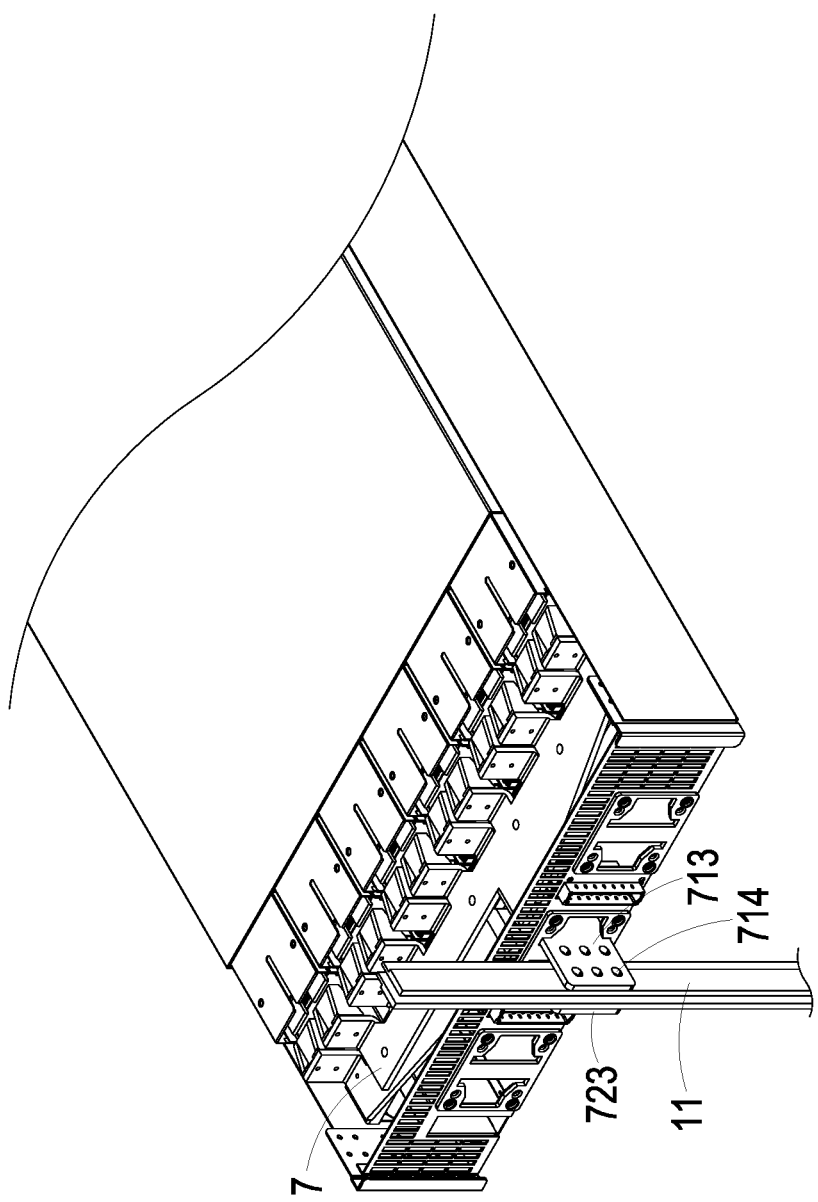
FIG. 7F is a schematic view showing the connections among the power supply units, the bus bar assembly and the rack bus bar.

FIG. 7A is a schematic perspective view illustrating the bus bar assembly of the power distribution shelf of FIG. 2A, FIG. 7B is an explored view showing the bus bar assembly of FIG. 7A, FIG. 7C is a schematic perspective view illustrating an example of the clip-type power connector of the bus bar assembly of FIG. 7A, FIG. 7D is a schematic perspective view illustrating the clip-type power connector of FIG. 7C at another viewing angle, FIG. 7E is a schematic view showing the bus bar assembly fastened within the chassis, and FIG. 7F is a schematic view showing the connections among the power supply units, the bus bar assembly and the rack bus bar. As shown in FIGS. 7A, 7B, 7C, 7D, 7E and 7F, the bus bar assembly 7 includes a first linking bus bar 71 and a second linking bus bar 72. The first linking bus bar 71 and the second linking bus bar 72 are insulated with each other by an insulation member 73. The first linking bus bar 71 includes a first main bar 711, a plurality of first bending parts 712 and a first output part 713. The first bending parts 712 are connected with a first edge of the first main bar 711, and the first output part 713 is connected with a second edge of the first main bar 711, where the first edge is opposite to the second edge. The first bending parts 712 are arranged in a line, separated apart with each other at a specific interval and vertical to the first main bar 711. The second linking bus bar 72 includes a second main bar 721, a plurality of second bending parts 722 and a second output part 723. The second bending parts 722 are connected with a first edge of the second main bar 721, and the second output part 723 is connected with a second edge of the second main bar 721, where the first edge is opposite to the second edge. The second bending parts 722 are arranged in a line, separated apart with each other at a specific interval and vertical to the second main bar 721.

The first main bar 711 is disposed over the second main bar 721 and insulated with each other by the insulation member 73. The insulation member 73 is for example but not limited to an insulation gasket. The first bending parts 712 and the second bending parts 722 are staggered and arranged at the same plane. Namely, a first bending part 712 is disposed between any two neighboring second bending parts 722, and a second bending part 722 is disposed between any two neighboring first bending parts 712. The first output part 713 is vertical to the first main bar 711, and the second output part 723 is vertical to the second main bar 721. The first output part 713 and the second output part 723 are separated apart with each other at a specific interval and form a gap 74 therebetween. The gap 74 of the bus bar assembly 7 is configured to clip the rack bus bar 11 of the server rack 1. Namely, two vertical bus members of the rack bus bar 11 is in contact with the first output part 713 and the second output part 723 of the bus bar assembly 7 respectively.

A plurality of clip-type power connectors 75 are mounted on and in contact with the first bending parts 712 and the second bending parts 722 respectively and correspondingly. The clip-type power connectors 75 are arranged on the same plane and aligned and mating with the power output electrodes of the power supply units 4 respectively and correspondingly. In an embodiment, each of the clip-type power connectors 75 includes an insulation body 751, a first conducting clip 752 and a second conducting clip 753. The insulation body 751 includes a first end opening 754, a second end opening 755 and a third end opening 756. The first end opening 754, the second end opening 755 and the third end opening 756 are in communication with each other. The first end opening 754 is located at the top side of the insulation body 751, and the second end opening 755 and the third end opening 756 are located at the bottom side of the insulation body 751. The first conducting clip 752 and the second conducting clip 753 are disposed within the insulation body 751. One terminal of the first conducting clip 752 and one terminal of the second conducting clip 753 are disposed within the insulation body 751 and are close to the first end opening 754. The other terminal of the first conducting clip 752 is extending outwardly from the second end opening 755 and bent. The other terminal of the second conducting clip 753 is extending outwardly from the third end opening 756 and bent. The bending parts of the first conducting clip 752 and the second conducting clip 753 are respectively extending toward the opposite direction. The bending parts of the first conducting clip 752 and the second conducting clip 753 of each clip-type power connector 75 can be fastened to and connected with the first bending part 712 of the first linking bus bar 71 or the second bending part 722 of the second linking bus bar 72.

Each of the power supply units 4 has a first power output electrode 42 and a second power output electrode 43 (see FIG. 5). The first power output electrode 42 is clipped by and in contact with a corresponding clip-type power connector 75 of the corresponding first bending part 712, and the second power output electrode 43 is clipped by and in contact with a corresponding clip-type power connector 75 of the corresponding second bending part 722. The clip-type power connector is securely mounted on and electrically connected with the corresponding first bending part 712, or is securely mounted on and electrically connected with the corresponding second bending part 722. Consequently, the DC output power outputted by the power supply unit 4 via the first power output electrode 42 and the second power output electrode 43 can be transferred to the rack bus bar 11 through the first output part 713 of the first linking bus bar 71 and second output part 723 of the second linking bus bar 72. In an embodiment, the first output part 713 of the first linking bus bar 71 further includes a plurality of first holes 714, and the second output part 723 of the second linking bus bar 72 further includes a plurality of second holes 724. The first holes 714 are corresponding to the second holes 724 respectively. As shown in FIG. 7F, the first holes 714 and the second holes 724 are configured to allow the rack bus bar 11 of the server rack 1 to be securely mounted in the gap 74 between the first output part 713 and the second output part 723. The first hole 714 and the second hole 724 are for example but not limited to the screw holes for screwing.

In an embodiment, the first linking bus bar 71 has six first bending parts 712 and six clip-type power connectors 75 corresponding to and aligned with the six first power output electrodes 42 of the six power supply units 4 respectively. The second linking bus bar 72 has six second bending parts 722 and six clip-type power connectors 75 corresponding to and aligned with the six second power output electrodes 43 of the six power supply units 4 respectively. Preferably but not exclusively, the first linking bus bar 71 and the second linking bus bar 72 are copper plates. In an embodiment, the second linking bus bar 72 is grounded. In an embodiment, the bus bar assembly 7 is fastened within the chassis 3 via the first bracket 36, but it is not limited thereto. In an embodiment, the clip-type power connector 75 is floating and mounted on the first bending part 712 or the second bending part 722. Consequently, the power output electrodes (42, 43) of the power supply units 4 can be blind inserted into the clip-type power connectors 75 of the bus bar assembly 7.

Please refer to FIG. 7E. In this embodiment, two AC input power connectors 8 are fastened on the bottom plate of the chassis 3 and close to an edge of the bottom plate. The two AC input power connectors 8 include a first AC input power connector 8a and a second AC input power connector 8b. The first AC input power connector 8a is electrically connected with a three phase AC power source, and the second AC input power connector 8b is electrically connected with a single phase AC power source, but they are not limited thereto. The two AC input power connectors 8 include a plurality of pins respectively. The pins can be for example but not limited to seven pins, six of them are configured as power pins, and the other one is configured as a ground pin. Each of the AC input power connectors 8 are electrically connected with each one of the third connectors 65 via plural power cable 81. Namely, each of the six third connectors 65 is electrically connected with the first AC input power connector 8a via power cables 81 and electrically connected with the second AC input power 8b via the power cables 81. Consequently, the AC input power from the two AC power sources can be transferred to the power supply units 4 via the AC input power connectors 8, the third connectors 65 and the first connectors 63, and switch between the two AC power sources. In an embodiment, the two AC input power connectors 8 are electrically connected with two three phase AC power sources respectively, or are electrically connected with the single phase AC power sources respectively, but not exclusively.

Figure 8:
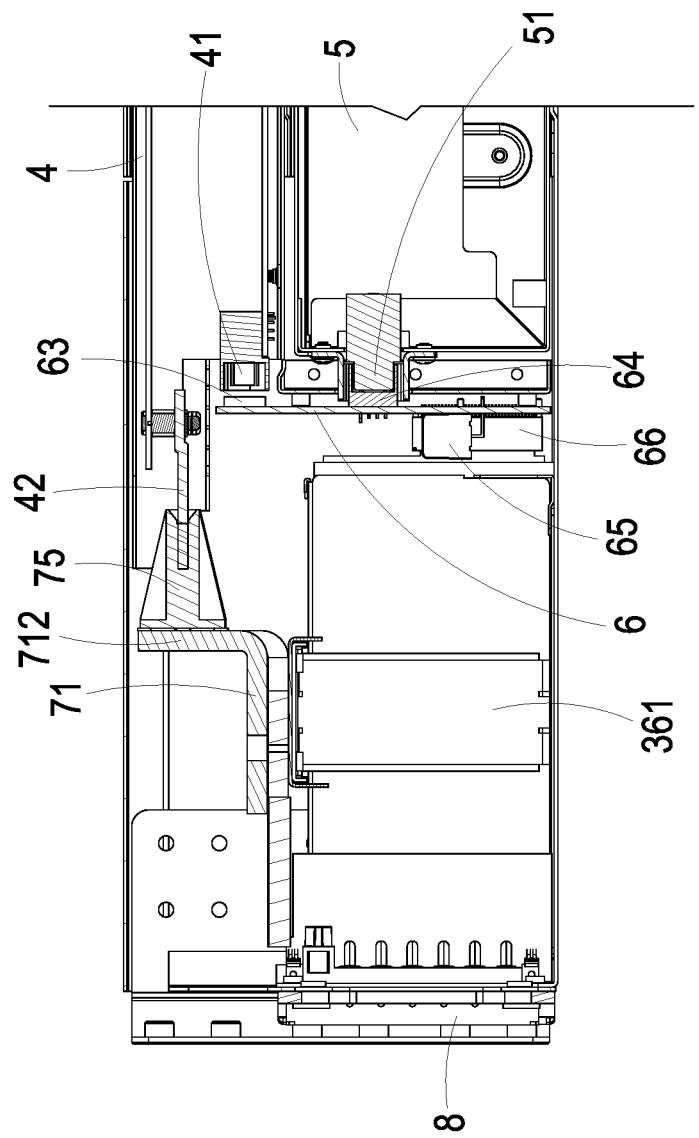
FIG. 8 is a cross-sectional view showing the electrical and mechanical connections among the power supply unit, the battery backup unit, the mid-plane circuit board and the bus bar assembly.

FIG. 8 is a cross-sectional view showing the electrical and mechanical connections among the power supply unit, the battery backup unit, the mid-plane circuit board and the bus bar assembly. As shown in FIG. 8, the power output electrode 42 of the power supply unit 4 is inserted into and connected with the clip-type power connector 75 of the bus bar assembly 7. The first connection interface 41 of the power supply unit 4 is connected with the first connector 63 of the mid-plane circuit board 6. The second connection interface 51 of the battery backup unit 5 is connected with the second connector 64 of the mid-plane circuit board 6. The AC input power connectors 8 are electrically connected with the two AC power sources via external power cables (not shown), and each of the AC input power connectors 8 is electrically connected with each one of the third connector 65 of the mid-plane circuit board 6. Consequently, the electrical and mechanical connecting structures among the power supply units 4, the battery backup units 5, the power shelf controller 9 and the two AC power sources are simplified via the mid-plane circuit board 6. In addition, the bus bar assembly 7 is employed in the power distribution shelf 2 to transfer the DC output power from the power supply units 4 to the rack bus bar 11. Consequently, the purposes of further miniaturization of the power distribution shelf 2 and improvement in energy efficiency are achieved. Moreover, the cost is reduced and the reliability is enhanced.

In this embodiment, the power distribution shelf 2 receives the AC input power from two AC power sources. In addition, each power supply unit 4 has an integrated automatic transfer switch capable of switching the AC input power from the two AC power sources according to the status. Each power supply unit 4 has a dedicated battery backup unit 5 that can provide backup power to the server within the rack server 1 during the AC input power from the two AC power sources is outage. Moreover, each pair of the power supply unit 4 and the battery backup unit 5 can perform current sharing functions between each other, and the power supply unit 4 has a charging/discharging circuit, so that the power supply unit 4 can charge the battery backup unit 5 and the battery backup unit 5 can discharge to the power supply unit 4. Furthermore, the power distribution shelf 2 can report the status of individual pair of the power supply unit 4 and the battery backup unit 5 over for example but not limited to PMbus (Power Management Bus) when the AC input power drops or is failure. The power shelf controller 9 can communicate with the power supply units 4 and the battery backup units 5 and monitor and control the operations of the individual pair of the power supply unit 4 and the battery backup unit 5.

Figure 9A:
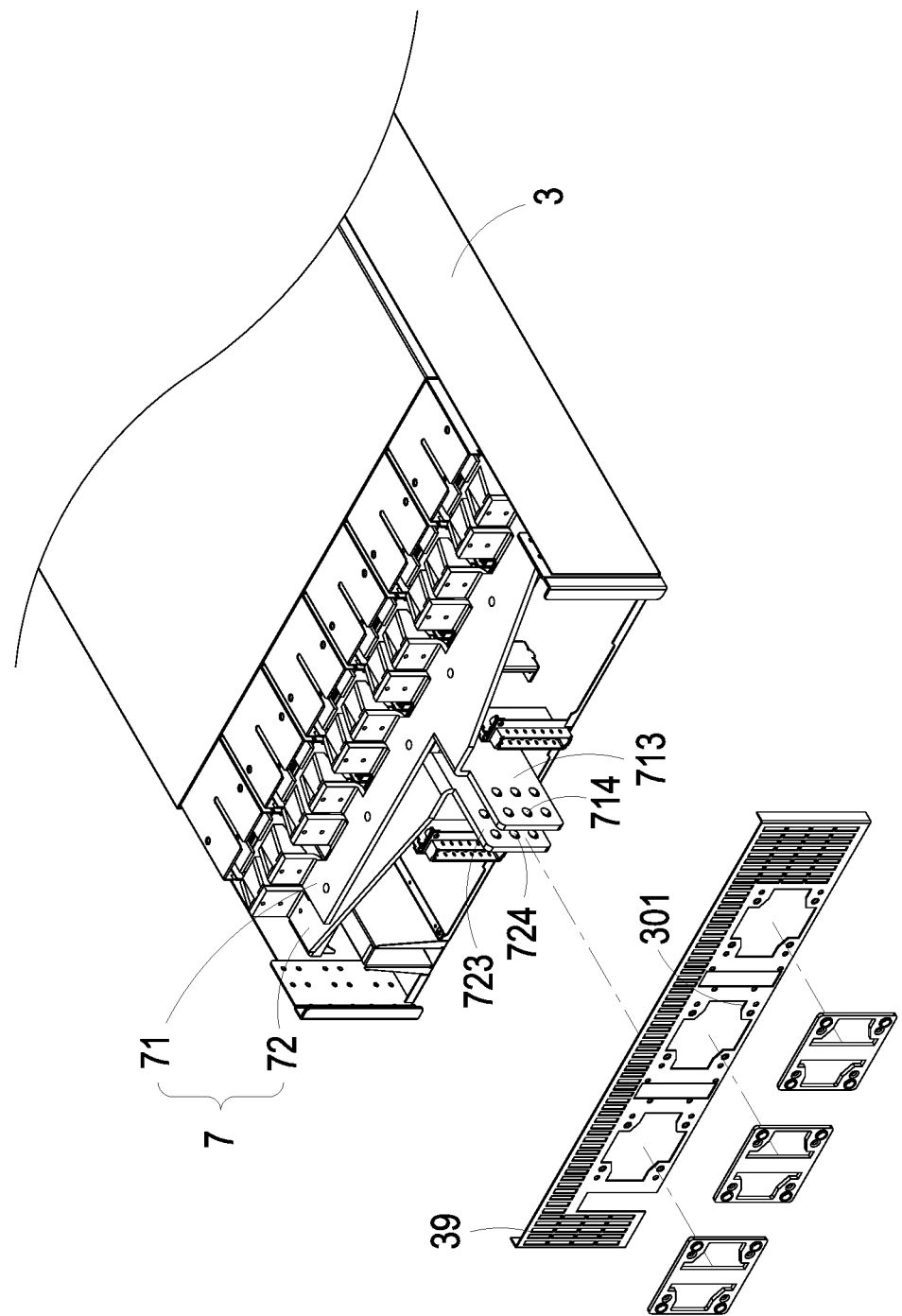
FIG. 9A is a schematic perspective view illustrating the relationships between the output parts of the bus bar assembly and the rear plate of the chassis.
Figure 9B:
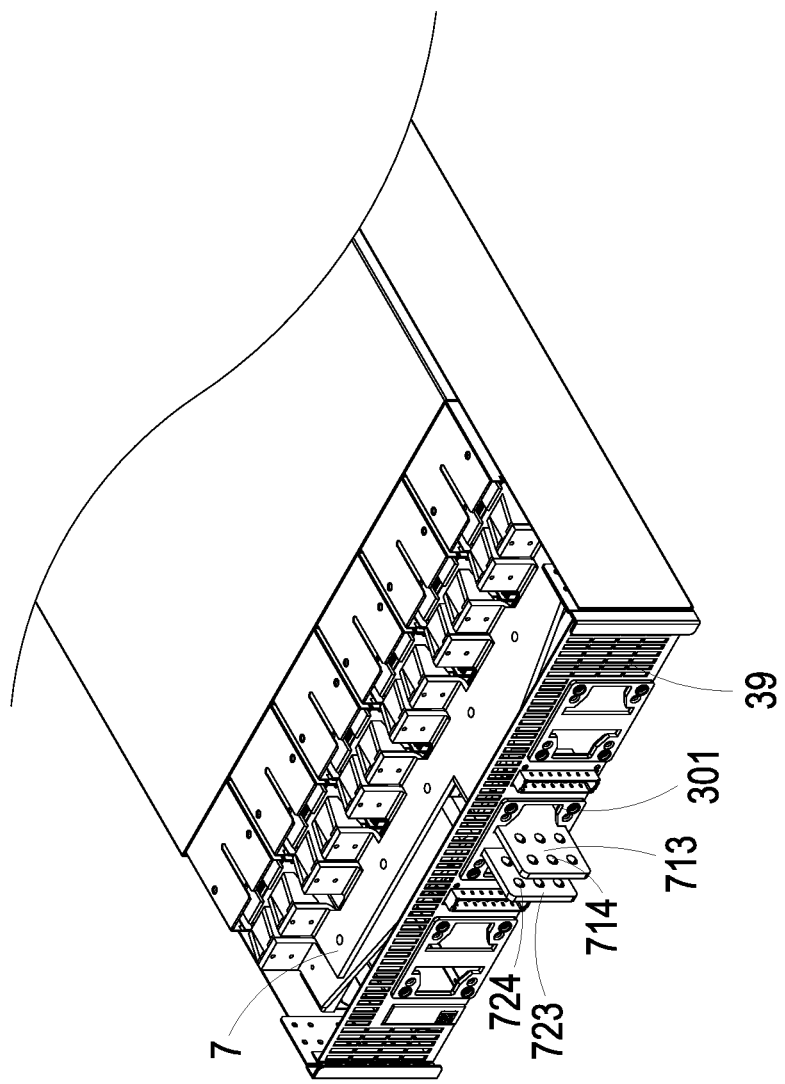
FIG. 9B is a schematic view showing the location of the output parts located at the rear plate of the chassis.

FIG. 9A is a schematic perspective view illustrating the relationships between the output parts of the bus bar assembly and the rear plate of the chassis, and FIG. 9B is a schematic view showing the location of the output parts located at the rear plate of the chassis. As shown in FIGS. 9A and 9B, the chassis 3 includes the rear plate 39 having three openings 301. The first output part 713 and the second output part 723 of the bus bar assembly 7 are extending outwardly from a middle one of the three openings 301. Namely, the first output part 713 and the second output part 723 of the bus bar assembly 7 are protruded out from the rear plate 39 of the chassis 3.

Figure 10A:
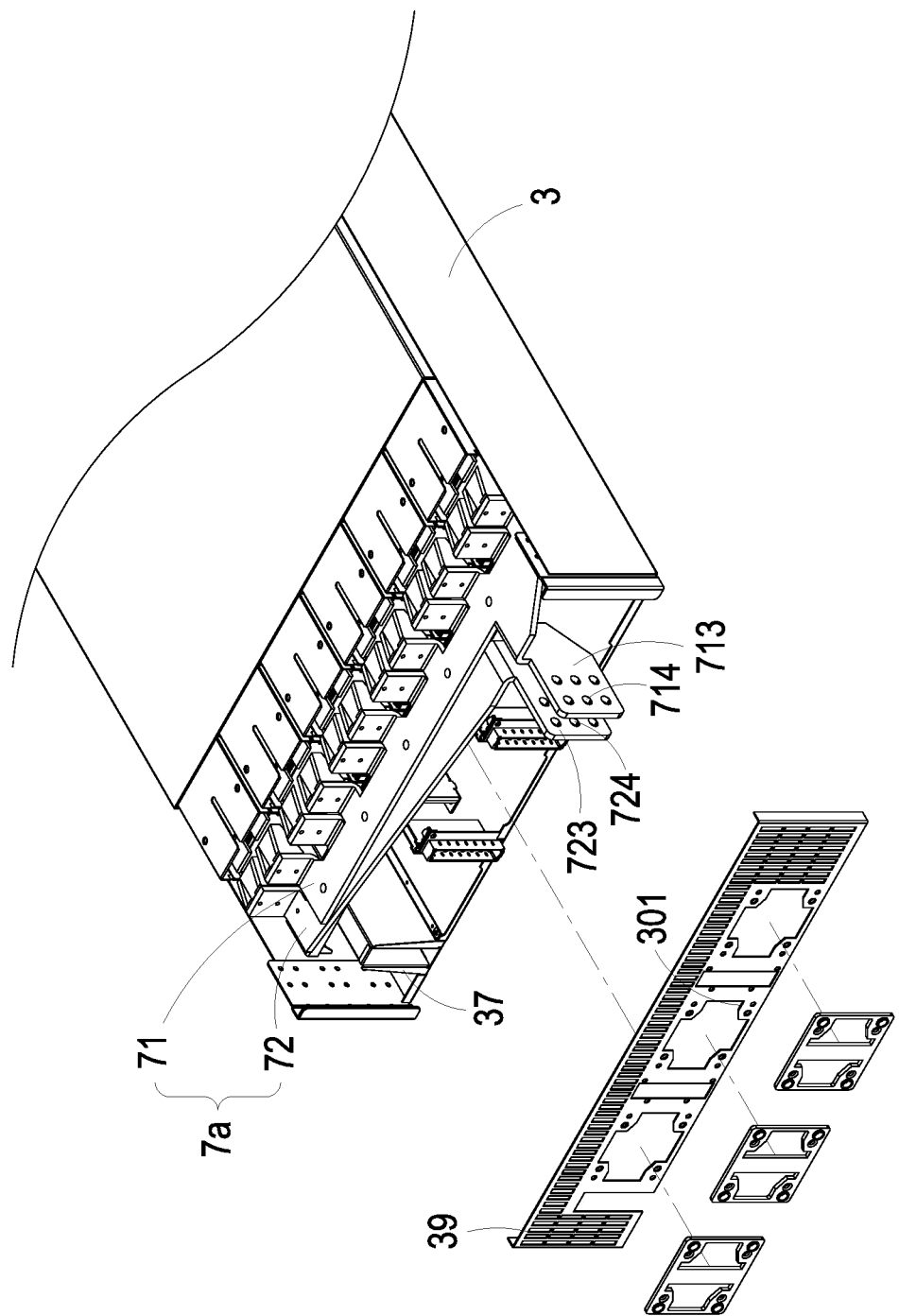
FIGS. 10A, 11A and 12A are schematic perspective views illustrating the relationships between the rear plate of the chassis and the output parts of various examples of the bus bar assembly.
Figure 10B:
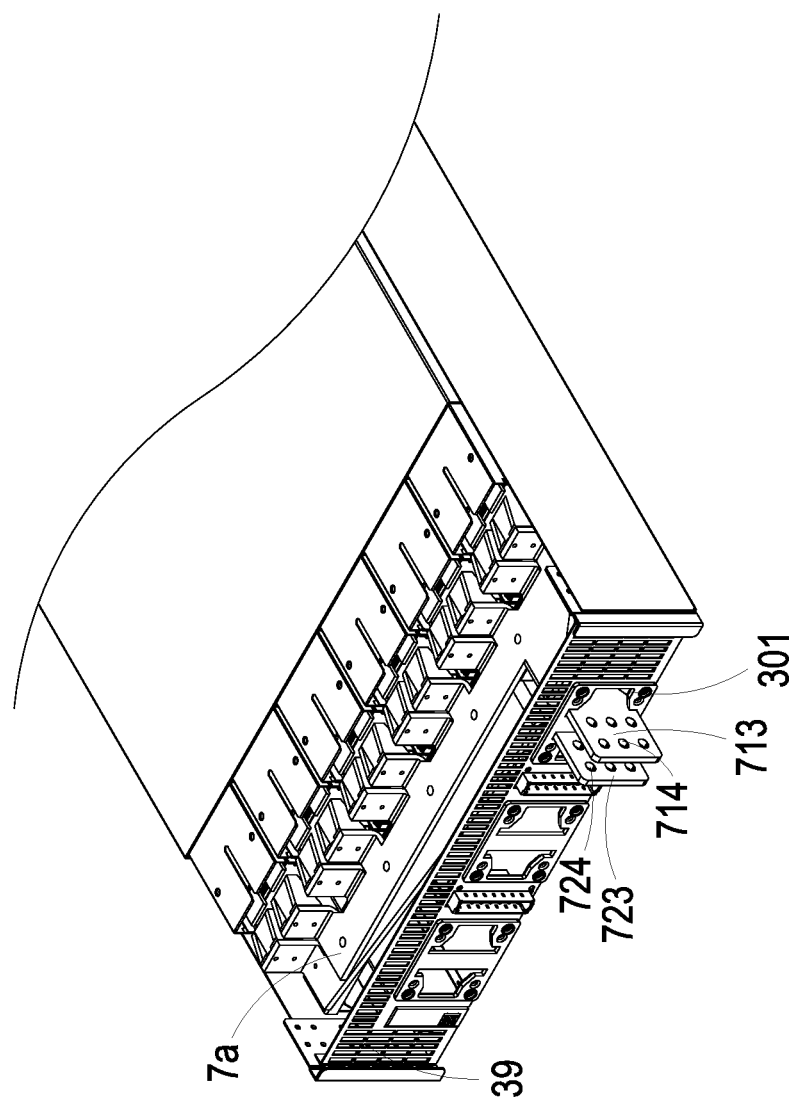
FIGS. 10B, 11B and 12B are schematic views respectively showing the location of the output parts of FIGS. 10A, 11A and 12A located at the rear plate of the chassis.
Figure 11A:
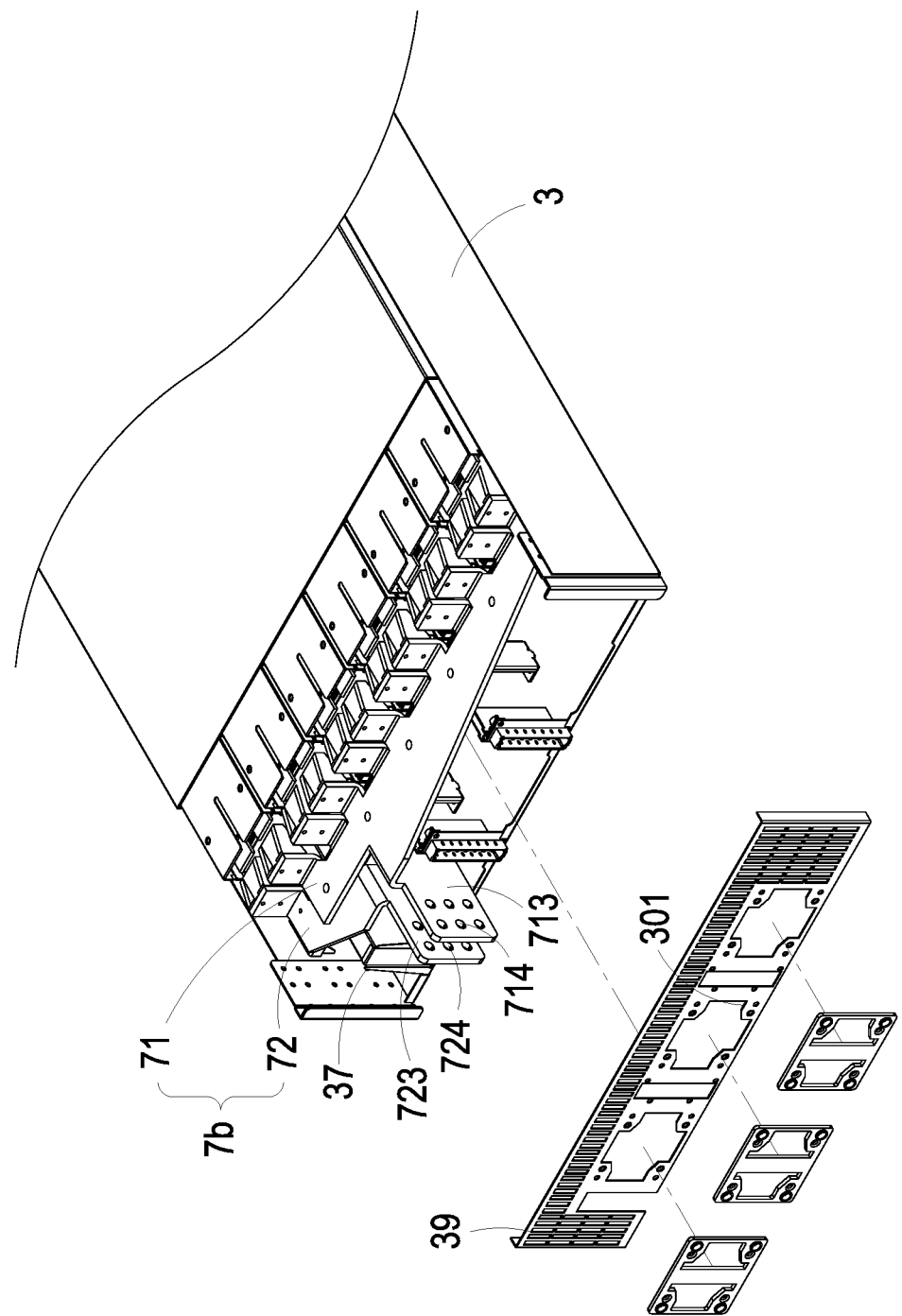
Figure 11B:
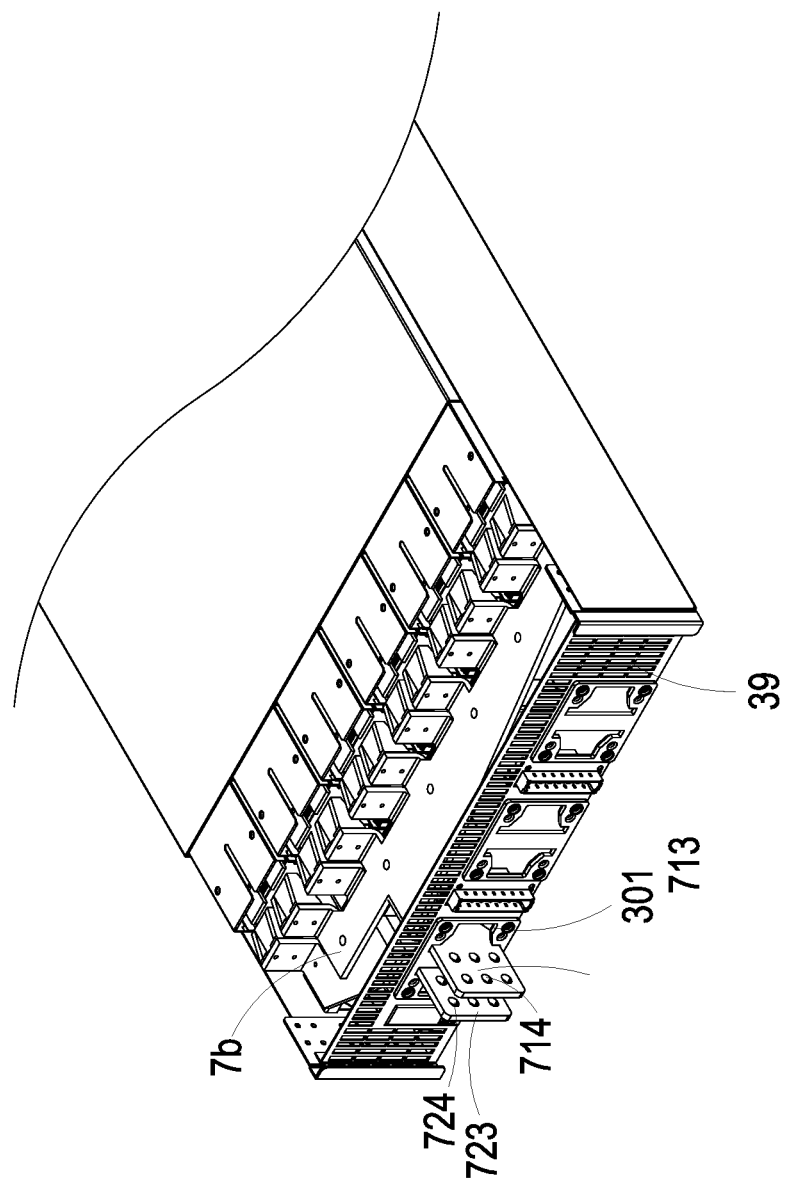
Figure 12A:
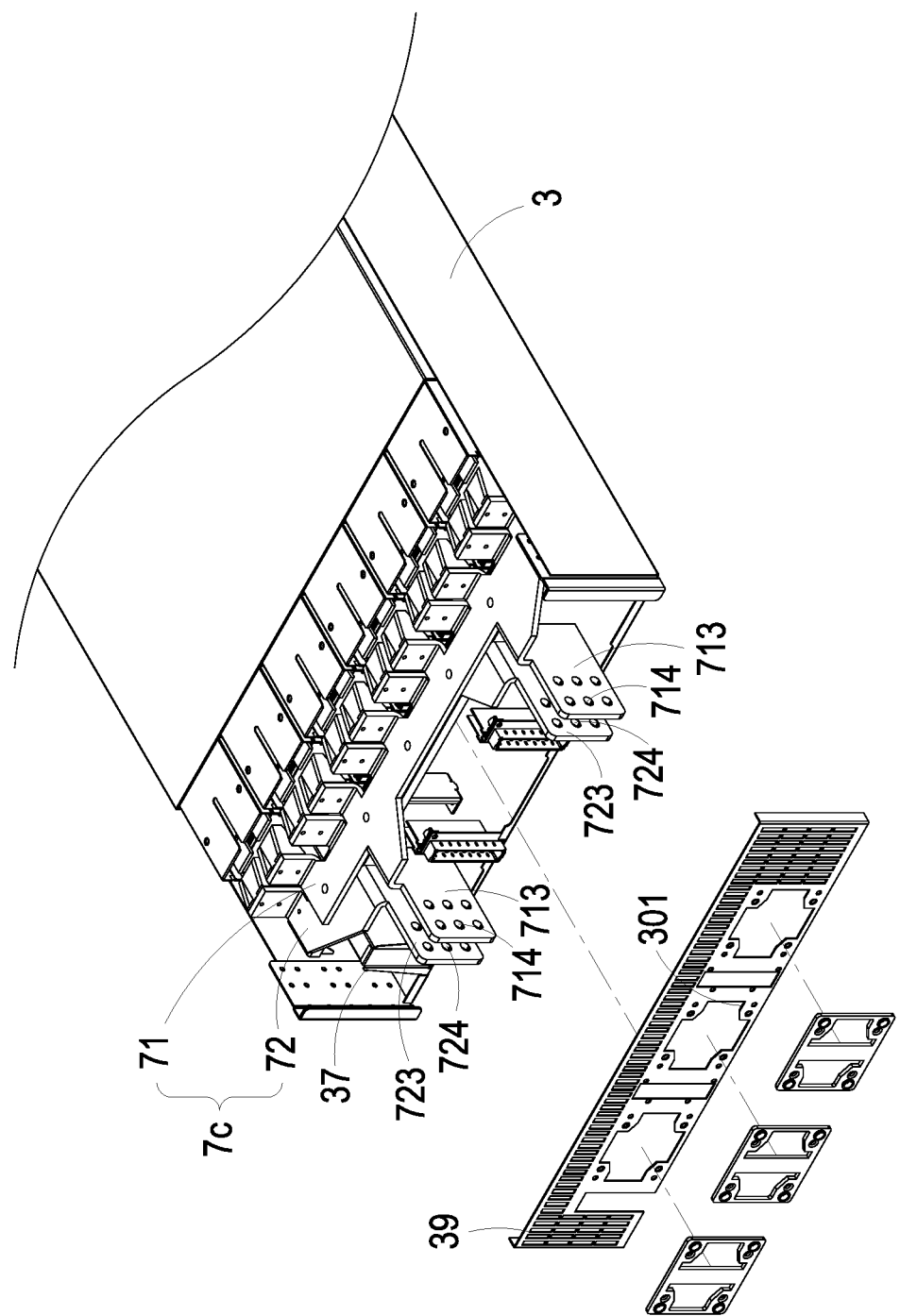
Figure 12B:
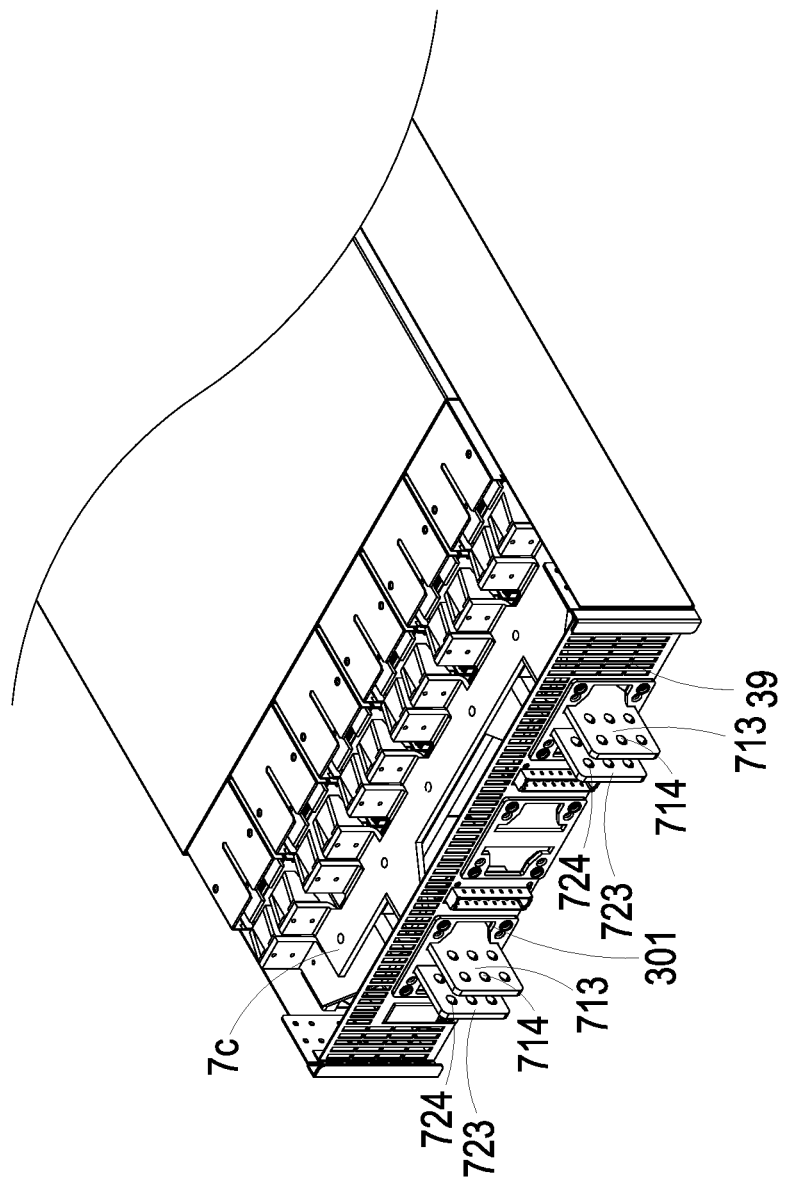

The structure of the bus bar assembly 7 is not limited to that illustrated in above-mentioned embodiments. Various examples of the bus bar assembly 7 are described as follows, but the structure of the bus bar assembly 7 is not limited thereto. FIGS. 10A, 11A and 12A are schematic perspective views illustrating the relationships between the rear plate of the chassis and the output parts of various examples of the bus bar assembly, and FIGS. 10B, 11B and 12B are schematic views respectively showing the location of the output parts of FIGS. 10A, 11A and 12A located at the rear plate of the chassis. The component parts and elements corresponding to those of FIGS. 9A and 9B are designated by identical numeral references, and detailed descriptions thereof are omitted. In an embodiment, the first output part 713 and the second output part 723 of the bus bar assembly 7 are extending outwardly from the other one of the three openings 301. For example shown in FIGS. 10A and 10B, the first output part 713 and the second output part 723 of the bus bar assembly 7a are extending outwardly from the opening 301 furthest from the second bracket 37. Alternatively, for example shown in FIGS. 11A and 11B, the first output part 713 and the second output part 723 of the bus bar assembly 7b are extending outwardly from the opening 301 close to the second bracket 37. In an embodiment, the bus bar assembly 7 includes two pairs of the first output parts 713 and the second output parts 723, and the two pairs of the first output parts 713 and the second output parts 723 are extending outwardly from any two of the three openings 301. For example shown in FIGS. 12A and 12B, one pair of the first output part 713 and the second output part 723 of the bus bar assembly 7c are extending outwardly from the opening 301 furthest from the second bracket 37, and the other pair of the first output part 713 and the second output part 723 of the bus bar assembly 7c are extending outwardly from the opening 301 close to the second bracket 37.

Please refer to FIG. 12A again. In this embodiment, the bus bar assembly 7c includes two first output parts 713 and two second output parts 723. The two first output parts 713 are disposed corresponding to the second output parts 723 respectively. The two first output parts 713 and the two second output parts 723 compose two pairs of the first output parts 713 and the second output parts 723. The structure of any pair of the first output part 713 and the second output part 723 is similar to that shown in above-mentioned embodiments, and is not redundantly described herein.

Figure 13:
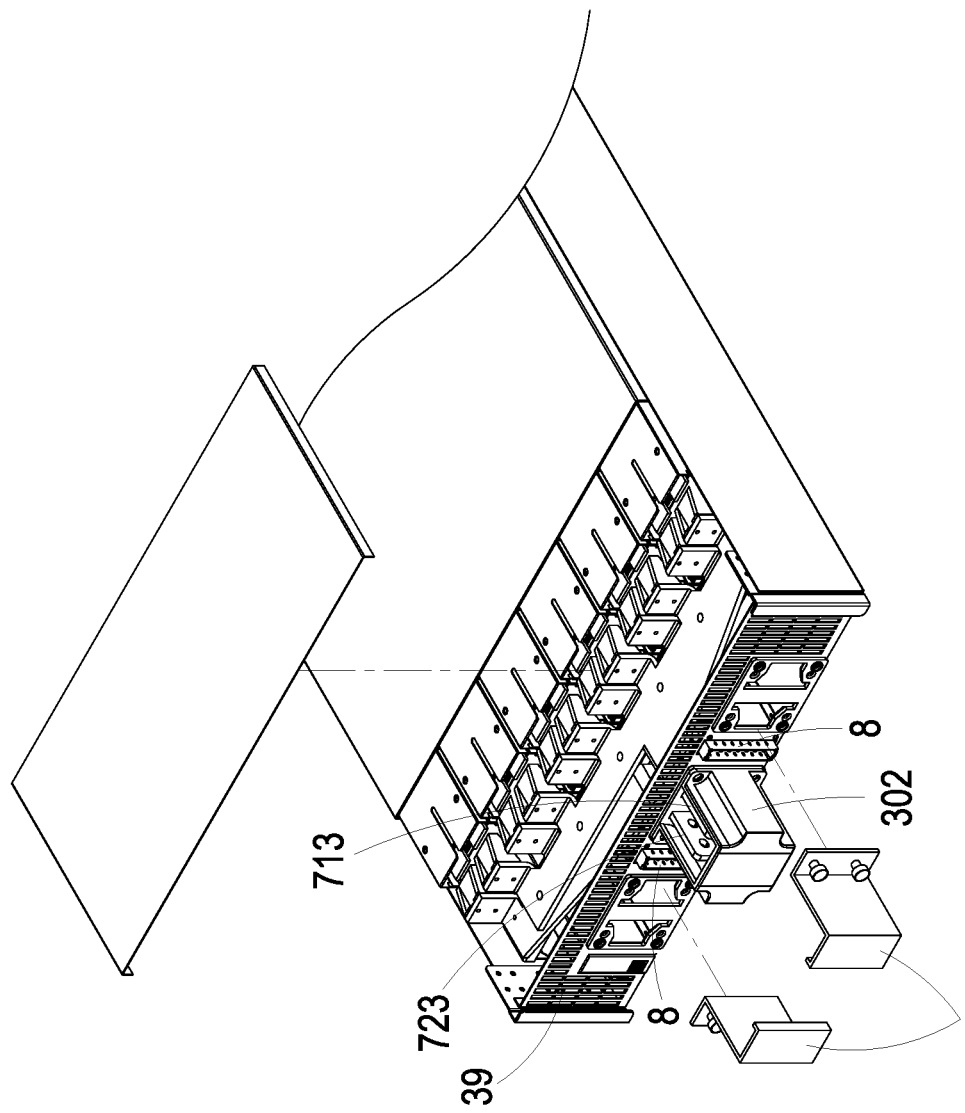
FIG. 13 is a schematic perspective view illustrating another example of the power distribution shelf of FIG. 2A.

FIG. 13 is a schematic perspective view illustrating another example of the power distribution shelf of FIG. 2A. As shown in FIG. 10, in an embodiment, the chassis 3 further includes a first protection bracket 302 and two second protection brackets 303. The first protection bracket 302 can be fastened on the rear plate 39 and cover the first output part 713 and the second output part 723. Consequently, the connections between the rack bus bar 11 and the first output part 713 and the second output part 723 of the bus bar assembly 7 can be protected. The two second protection brackets 303 can be fastened on the rear plate 39 and aligned with the two AC input power connectors 8 respectively and correspondingly. When the AC input power connector 8 is plugged with a corresponding external AC power cable (not shown), the external AC power cable can be securely and the external AC power cable can't be drawn out. Consequently, the AC input power connectors 8 and the external AC power cables are protected.

In an embodiment, as shown in FIGS. 5, 6A and 8, the second connection interfaces 51 of the battery backup units 5 are floated. Consequently, the second connection interfaces 51 of the battery backup units 5 can be blind inserted in the second connectors 64 of the mid-plane circuit board 6 to ensure the connections between the battery backup units 5 and the mid-plane circuit board 6.

In an embodiment, as shown in FIGS. 5, 6A and 8, the rear plates of the power supply units 4 are omitted. After the first connection interfaces 41 of the power supply units 4 are connected with the first connectors 63 of the mid-plane circuit board 6 respectively, the cooling airflow provided by the fans (not shown) within the power supply units 4 can be introduced to the bus bar assembly 7 directly. Consequently, the heat can be transferred to the surrounding, and the heat-dissipation effect is enhanced without adding any fan within the chassis 3.

From the above descriptions, the present disclosure provides a multiple input power distribution shelf and a bus bar assembly thereof. The inventive power distribution shelf allows the hot-swappable power supply units and the hot-swappable battery backup units to be installed in a single chassis and allows the power supply units to connect with two AC power sources and switch between the two AC power sources according to the status. Consequently, it is labor-saving, time-saving and cost-saving to install and maintain the power supply units and the battery backup units, and the power distribution shelf can provide required DC output power to the server rack continuously. In addition, the inventive multiple input power distribution shelf and a bus bar assembly thereof have high power distribution efficiency and excellent heat-dissipation efficiency. The electrical and mechanical connecting structures among the power supply units, the battery backup units, the power shelf controller and the multiple AC power sources are simplified via a mid-plane circuit board. In addition, a bus bar assembly is employed in the power distribution shelf to transfer the DC output power from the power supply units to the rack bus bar. Consequently, the purposes of further miniaturization of the power distribution shelf and improvement in energy efficiency are achieved. Moreover, the cost is reduced and the reliability is enhanced.

While the disclosure has been described in terms of what is presently considered to be the most practical and preferred embodiments, it is to be understood that the disclosure needs not be limited to the disclosed embodiment.

What is claimed is:

1. A multiple input power distribution shelf installed in a server rack and selectively receiving an AC input power from plural AC power sources electrically connected therewith, the multiple input power distribution shelf converting the AC input power into a DC output power and providing the DC output power to a rack bus bar of the server rack, the multiple input power distribution shelf comprising:
   a chassis;
   plural AC input power connectors mounted in the chassis and configured to electrically connect with the plural AC power sources and receive the AC input power;
   plural power supply units detachably mounted in the chassis, wherein each of the plural power supply units has an integrated automatic transfer switch capable of switching the AC input power from the plural AC power sources;
   plural battery backup units detachably mounted in the chassis and electrically connected with the plural power supply units respectively;
   a mid-plane circuit board electrically connected with the plural AC input power connectors, the plural power supply units and the plural battery backup units;
   a bus bar assembly mounted in the chassis and configured to connect with the plural power supply units and the rack bus bar of the server rack, wherein the power outputted by the plural power supply units is transferred to the rack bus bar through the bus bar assembly; and
   a power shelf controller mounted in the chassis and electrically connected with the mid-plane circuit board, wherein the power shelf controller communicates with the plural power supply units and plural battery backup units;
   wherein each of the plural power supply units comprises a first connection interface, each of the plural battery backup units comprises a second connection interface, the power shelf controller comprises a third connection interface, and the mid-plane circuit board comprises:
   a first surface;
   a second surface opposite to first surface,
   plural first connectors mounted on the first surface and aligned and mating with the plural first connection interface of the plural power supply units;
   plural second connectors mounted on the first surface and aligned and mating with the plural second connection interfaces of the plural battery backup units;
   plural third connectors mounted on the second surface, wherein each of the plural third connectors is electrically connected with the plural AC input power connectors respectively via plural power cables; and
   a fourth connector mounted on the second surface and configured to electrically connected with the third connection interface of the power shelf controller.

2. The multiple input power distribution shelf according to claim wherein each of the plural first connectors comprises:
   a first group of pins electrically coupled with plural power pins of the corresponding third connector via plural trace patterns of the mid-plane circuit board;

a second group of pins electrically coupled with plural power pins of the corresponding second connector via plural trace patterns of the mid-plane circuit board; and a third group of pins electrically coupled with plural signal pins of the corresponding second connector and plural signal pins of the fourth connector via plural trace patterns of the mid-plane circuit board.

3. The multiple input power distribution shelf according to claim 1, wherein the chassis comprises a bracket mounted on a bottom plate of the chassis and defining a receiving space, and the receiving space is configured to accommodate the power shelf controller.

4. The multiple input power distribution shelf installed in a server rack and selectively receiving an AC input power from plural AC power sources electrically connected therewith, the multiple input power distribution shelf converting the AC input power into a DC output power and providing the DC output power to a rack bus bar of the server rack, the multiple input power distribution shelf comprising:

a chassis;

plural AC input power connectors mounted in the chassis and configured to electrically connect with the plural AC power sources and receive the AC input power;

plural power supply units detachably mounted in the chassis, where each of the plural power supply units has an integrated automatic transfer switch capable of switching the AC input power from the plural AC power sources;

plural battery backup units detachably mounted in the chassis and electrically connected with the plural power supply units respectively;

a mid-plane circuit board electrically connected with the plural AC input power connectors, the plural power supply units and the plural battery backup units; and a bus bar assembly mounted in the chassis and configured to connect with the plural power supply units and the rack bus bar of the server rack, wherein the power outputted by the plural power supply units is transferred to the rack bus bar through the bus bar assembly;

wherein the chassis comprises an accommodation space having a first compartment and a second compartment, the first compartment and the second compartment are separated by a plate, the first compartment comprises plural first slots, the second compartment comprises plural second slots, the plural first slots and the plural second slots are defined by plural baffles within the first compartment and the second compartment respectively, the plural power supply units are detachably installed into the first slots respectively, and the plural battery backup units are detachably installed into the second slots respectively;

wherein the chassis further comprises a partition plate, the partition plate is disposed in the accommodation space and at least partially covering an opening of the first compartment and an opening of the second compartment, the partition plate comprises plural first through holes and plural second through holes, the plural first through holes are corresponding to the plural first slots, the plural second through holes are corresponding to the plural second slots, wherein the partition plate comprises plural first protrusions and plural second protrusions, each of the plural baffles comprises a hook, the mid-plane circuit board comprises plural first fixing holes, plural second fixing holes and plural third fixing holes, the plural first fixing holes are corresponding to and engaging with the first protrusions respectively, the plural second fixing holes are corresponding to and engaging with the second protrusions respectively, and the plural third fixing holes are corresponding to and engaging with the plural hooks respectively.

5. The multiple input power distribution shelf according to claim 1, wherein the chassis comprises a bracket connected to two opposite sidewalls of the chassis, the bracket is configured to support the bus bar assembly, wherein the chassis further comprises at least one supporting pillar, one terminal of the supporting pillar is connected to the bracket, the other terminal of the supporting pillar is connected to a bottom plate of the chassis, and the supporting pillar is configured to support the bracket.

6. The multiple input power distribution shelf according to claim 1, wherein the battery backup unit discharges stored electric energy to the corresponding power supply unit, and the battery backup unit is charged by the corresponding power supply unit.

7. A multiple input power distribution shelf installed in a server rack and selectively receiving an AC input power from plural AC power sources electrically connected therewith, the multiple input power distribution shelf converting the AC input power into a DC output power and providing the DC output power to a rack bus bar of the server rack, the multiple input power distribution shelf comprising:

a chassis;

plural AC input power connectors mounted in the chassis and configured to electrically connect with the plural AC power sources and receive the AC input power;

plural power supply units detachably mounted in the chassis, wherein each of the plural power supply units has an integrated automatic transfer switch capable of switching the AC input power from the plural AC power sources;

plural battery backup units detachably mounted in the chassis and electrically connected with the plural power supply units respectively;

a mid-plane circuit board electrically connected with the plural AC input power connectors, the plural power supply units and the plural battery backup units;

a bus bar assembly mounted in the chassis and configured to connect with the plural power supply units and the rack bus bar of the server rack, wherein the power outputted by the plural power supply units is transferred to the rack bus bar through the bus bar assembly; and wherein the bus bar assembly comprises:

a first linking bus bar comprising a first main bar, plural first bending parts and at least one first output part, wherein the first bending part and the at least one first output part are connected to two opposite sides of the first main bar respectively, and the plural first bending parts are separated apart from each other at a specific interval;

a second linking bus bar corresponding to the first linking bus bar and comprising a second main bar, plural second bending parts and at least one second output part, wherein the second bending part and the at least one second output part are connected to two opposite sides of the second main bar respectively, and the plural second bending parts are separated apart from each other at a specific interval;

an insulation member disposed between the first main bar and the second main bar, wherein the first main bar and the second main bar are insulated from each other by the insulation member; and plural clip-type power connectors mounted on the plural first bending parts and the plural second bending parts, wherein the plural clip-type power connectors are configured to electrically connect with the plural power supply units;

wherein the first output part and the second output part are electrically connected with the rack bus bar of the server rack.

8. The multiple input power distribution shelf according to claim 7, wherein the rack bus bar comprises two bus members, the first output part of the first linking bus bar and the second output part of the second linking bus bar are connected with the two bus members respectively.

9. The multiple input power distribution shelf according to claim 7, wherein each of the plural power supply units comprises a first power output electrode and a second power output electrode, the first power output electrode is clipped by and in contact with the corresponding clip-type power connector mounted on the first bending part, and the second power output electrode is clipped by and in contact with the corresponding clip-type power connector mounted on the second bending part.

10. The multiple input power distribution shelf according to claim 7, wherein the first output part of the first linking bus bar comprises plural first holes, the second output part of the second linking bus bar comprises plural second holes corresponding to the first holes respectively, and the plural first holes and the plural second holes are configured for the rack bus bar being securely mounted in a gap between the first output part and the second output part.

11. The multiple input power distribution shelf according to claim 7, wherein the chassis includes a rear plate having three openings, and the plural AC input power connectors are at least partially protruded out from the rear plate.

12. The multiple input power distribution shelf according to claim 11, wherein the first output part and the second output part of the bus bar assembly extend outwardly from any one of the three openings and is protruded out from the rear plate.

13. The multiple input power distribution shelf according to claim 12, wherein the chassis further comprises a first protection bracket fastened on the rear plate, and the first protection bracket is configured to cover the first output part and the second output part.

14. The multiple input power distribution shelf according to claim 11, wherein the chassis further comprises plural second protection brackets securely mounted on the rear plate and aligned with the plural AC input power connectors respectively and correspondingly.

15. The multiple input power distribution shelf according to claim 11, wherein the bus bar assembly comprises two pairs of the first output parts and the second output parts, and the two pairs of the first output parts and the second output parts extend outwardly from any two of the three openings and are protruded out from the rear plate.

16. The multiple input power distribution shelf according to claim 1, wherein the plural AC input power connectors comprise a first AC input power connector and a second AC input power connector, the first AC input power connector is configured to receive a three phase AC power source, and the second AC input power connector is configured to receiver a single phase AC power source.

17. The multiple input power distribution shelf according to claim 4, wherein the chassis comprises a bracket connected to two opposite sidewalls of the chassis, the bracket is configured to support the bus bar assembly, wherein the chassis further comprises at least one supporting pillar, one terminal of the supporting pillar is connected to the bracket, the other terminal of the supporting pillar is connected to a bottom plate of the chassis, and the supporting pillar is configured to support the bracket.

18. The multiple input power distribution shelf according to claim 4, wherein the battery backup unit discharges stored electric energy to the corresponding power supply unit, and the battery backup unit is charged by the corresponding power supply unit.

19. The multiple input power distribution shelf according to claim 4, wherein the plural AC input power connectors comprise a first AC input power connector and a second AC input power connector, the first AC input power connector is configured to receive a three phase AC power source, and the second AC input power connector is configured to receiver a single phase AC power source.

20. The multiple input power distribution shelf according to claim 7, wherein the chassis comprises a bracket connected to two opposite sidewalls of the chassis, the bracket is configured to support the bus bar assembly, wherein the chassis further comprises at least one supporting pillar, one terminal of the supporting pillar is connected to the bracket, the other terminal of the supporting pillar is connected to a bottom plate of the chassis, and the supporting pillar is configured to support the bracket.

21. The multiple input power distribution shelf according to claim 7, wherein the battery backup unit discharges stored electric energy to the corresponding power supply unit, and the battery backup unit is charged by the corresponding power supply unit.

22. The multiple input power distribution shelf according to claim 7, wherein the plural AC input power connectors comprise a first AC input power connector and a second AC input power connector, the first AC input power connector is configured to receive a three phase AC power source, and the second AC input power connector is configured to receiver a single phase AC power source.

* * * * *